(12) United States Patent
Lelescu et al.

(10) Patent No.: US 9,106,784 B2
(45) Date of Patent: Aug. 11, 2015

(54) SYSTEMS AND METHODS FOR CONTROLLING ALIASING IN IMAGES CAPTURED BY AN ARRAY CAMERA FOR USE IN SUPER-RESOLUTION PROCESSING

(71) Applicant: Pelican Imaging Corporation, Santa Clara, CA (US)

(72) Inventors: Dan Lelescu, Morgan Hill, CA (US); Kartik Venkataraman, San Jose, CA (US)

(73) Assignee: Pelican Imaging Corporation, Santa Clara, CA (US)

( * ) Notice: Subject to any disclaimer, the term of this patent is extended or adjusted under 35 U.S.C. 154(b) by 26 days.

(21) Appl. No.: 13/802,507

(22) Filed: Mar. 13, 2013

(65) Prior Publication Data

US 2014/0267890 A1    Sep. 18, 2014

(51) Int. Cl.
*H04N 5/225* (2006.01)
*H04N 9/04* (2006.01)
*H01L 27/146* (2006.01)

(52) U.S. Cl.
CPC .......... *H04N 9/045* (2013.01); *H01L 27/14621* (2013.01); *H01L 27/14623* (2013.01); *H01L 27/14627* (2013.01); *H04N 5/2254* (2013.01); *H04N 5/2258* (2013.01)

(58) Field of Classification Search
USPC ........................................ 348/374; 250/208.1
See application file for complete search history.

(56) References Cited

U.S. PATENT DOCUMENTS

| | | | |
|---|---|---|---|
| 4,124,798 A | 11/1978 | Thompson | |
| 4,198,646 A | 4/1980 | Alexander et al. | |
| 4,323,925 A | 4/1982 | Abell et al. | |
| 4,460,449 A | 7/1984 | Montalbano | |
| 5,005,083 A | 4/1991 | Grage | |
| 5,327,125 A | 7/1994 | Iwase et al. | |
| 5,808,350 A | 9/1998 | Jack et al. | |

(Continued)

FOREIGN PATENT DOCUMENTS

| EP | 840502 A2 | 5/1998 |
|---|---|---|
| EP | 2336816 A2 | 6/2011 |

(Continued)

OTHER PUBLICATIONS

International Search Report and Written Opinion for International Application No. PCT/US13/46002, Search Completed Nov. 13, 2013, Mailed Nov. 29, 2013, 7 pgs.

(Continued)

*Primary Examiner* — Anthony J Daniels
(74) *Attorney, Agent, or Firm* — KPPB LLP

(57) ABSTRACT

Imager arrays, array camera modules, and array cameras in accordance with embodiments of the invention utilize pixel apertures to control the amount of aliasing present in captured images of a scene. One embodiment includes a plurality of focal planes, control circuitry configured to control the capture of image information by the pixels within the focal planes, and sampling circuitry configured to convert pixel outputs into digital pixel data. In addition, the pixels in the plurality of focal planes include a pixel stack including a microlens and an active area, where light incident on the surface of the microlens is focused onto the active area by the microlens and the active area samples the incident light to capture image information, and the pixel stack defines a pixel area and includes a pixel aperture, where the size of the pixel apertures is smaller than the pixel area.

26 Claims, 12 Drawing Sheets

(56) References Cited

U.S. PATENT DOCUMENTS

| | | |
|---|---|---|
| 5,832,312 A | 11/1998 | Rieger et al. |
| 5,880,691 A | 3/1999 | Fossum et al. |
| 5,933,190 A | 8/1999 | Dierickx et al. |
| 5,973,844 A | 10/1999 | Burger |
| 6,002,743 A | 12/1999 | Telymonde |
| 6,005,607 A | 12/1999 | Uomori et al. |
| 6,034,690 A | 3/2000 | Gallery et al. |
| 6,069,365 A | 5/2000 | Chow et al. |
| 6,124,974 A | 9/2000 | Burger |
| 6,137,535 A | 10/2000 | Meyers |
| 6,141,048 A | 10/2000 | Meyers |
| 6,163,414 A | 12/2000 | Kikuchi et al. |
| 6,175,379 B1 | 1/2001 | Uomori et al. |
| 6,239,909 B1 | 5/2001 | Hayashi et al. |
| 6,358,862 B1 | 3/2002 | Ireland et al. |
| 6,477,260 B1 | 11/2002 | Shimomura |
| 6,525,302 B2 | 2/2003 | Dowski, Jr. et al. |
| 6,563,537 B1 | 5/2003 | Kawamura et al. |
| 6,603,513 B1 | 8/2003 | Berezin |
| 6,611,289 B1 | 8/2003 | Yu |
| 6,628,330 B1 | 9/2003 | Lin |
| 6,635,941 B2 | 10/2003 | Suda |
| 6,639,596 B1 | 10/2003 | Shum et al. |
| 6,657,218 B2 | 12/2003 | Noda |
| 6,671,399 B1 | 12/2003 | Berestov |
| 6,765,617 B1 | 7/2004 | Tangen et al. |
| 6,771,833 B1 | 8/2004 | Edgar |
| 6,774,941 B1 | 8/2004 | Boisvert et al. |
| 6,795,253 B2 | 9/2004 | Shinohara |
| 6,819,358 B1 | 11/2004 | Kagle et al. |
| 6,879,735 B1 | 4/2005 | Portniaguine et al. |
| 6,903,770 B1 | 6/2005 | Kobayashi et al. |
| 6,909,121 B2 | 6/2005 | Nishikawa |
| 6,958,862 B1 | 10/2005 | Joseph |
| 7,085,409 B2 | 8/2006 | Sawhney et al. |
| 7,161,614 B1 | 1/2007 | Yamashita et al. |
| 7,199,348 B2 | 4/2007 | Olsen et al. |
| 7,262,799 B2 | 8/2007 | Suda |
| 7,292,735 B2 | 11/2007 | Blake et al. |
| 7,295,697 B1 | 11/2007 | Satoh |
| 7,369,165 B2 | 5/2008 | Bosco et al. |
| 7,391,572 B2 | 6/2008 | Jacobowitz et al. |
| 7,408,725 B2 | 8/2008 | Sato |
| 7,606,484 B1 | 10/2009 | Richards et al. |
| 7,633,511 B2 | 12/2009 | Shum et al. |
| 7,646,549 B2 | 1/2010 | Zalevsky et al. |
| 7,657,090 B2 | 2/2010 | Omatsu et al. |
| 7,675,080 B2 | 3/2010 | Boettiger |
| 7,675,681 B2 | 3/2010 | Tomikawa et al. |
| 7,706,634 B2 | 4/2010 | Schmitt et al. |
| 7,723,662 B2 | 5/2010 | Levoy et al. |
| 7,782,364 B2 | 8/2010 | Smith |
| 7,840,067 B2 | 11/2010 | Shen et al. |
| 7,986,018 B2 | 7/2011 | Rennie |
| 7,990,447 B2 | 8/2011 | Honda et al. |
| 8,000,498 B2 | 8/2011 | Shih et al. |
| 8,013,904 B2 | 9/2011 | Tan et al. |
| 8,027,531 B2 | 9/2011 | Wilburn et al. |
| 8,044,994 B2 | 10/2011 | Vetro et al. |
| 8,077,245 B2 | 12/2011 | Adamo et al. |
| 8,106,949 B2 | 1/2012 | Tan et al. |
| 8,126,279 B2 | 2/2012 | Marcellin et al. |
| 8,130,120 B2 | 3/2012 | Kawabata et al. |
| 8,131,097 B2 | 3/2012 | Lelescu et al. |
| 8,180,145 B2 | 5/2012 | Wu et al. |
| 8,189,089 B1 | 5/2012 | Georgiev et al. |
| 8,212,914 B2 | 7/2012 | Chiu |
| 8,213,711 B2 | 7/2012 | Tam et al. |
| 8,231,814 B2 | 7/2012 | Duparre |
| 8,242,426 B2 | 8/2012 | Ward et al. |
| 8,244,027 B2 | 8/2012 | Takahashi |
| 8,254,668 B2 | 8/2012 | Mashitani et al. |
| 8,280,194 B2 | 10/2012 | Wong et al. |
| 8,289,409 B2 | 10/2012 | Chang |
| 8,305,456 B1 | 11/2012 | McMahon |
| 8,345,144 B1 | 1/2013 | Georgiev et al. |
| 8,360,574 B2 | 1/2013 | Ishak et al. |
| 8,406,562 B2 | 3/2013 | Bassi et al. |
| 8,446,492 B2 | 5/2013 | Nakano et al. |
| 8,514,491 B2 | 8/2013 | Duparre |
| 8,542,933 B2 | 9/2013 | Venkataraman et al. |
| 8,553,093 B2 | 10/2013 | Wong et al. |
| 8,559,756 B2 | 10/2013 | Georgiev et al. |
| 8,655,052 B2 | 2/2014 | Spooner et al. |
| 8,682,107 B2 | 3/2014 | Yoon et al. |
| 8,692,893 B2 | 4/2014 | McMahon |
| 8,780,113 B1 | 7/2014 | Ciurea et al. |
| 8,804,255 B2 | 8/2014 | Duparre |
| 8,830,375 B2 | 9/2014 | Ludwig |
| 8,831,367 B2 | 9/2014 | Venkataraman et al. |
| 8,854,462 B2 | 10/2014 | Herbin et al. |
| 8,866,920 B2 | 10/2014 | Venkataraman et al. |
| 8,878,950 B2 | 11/2014 | Lelescu et al. |
| 8,885,059 B1 | 11/2014 | Venkataraman et al. |
| 8,896,594 B2 | 11/2014 | Xiong et al. |
| 8,896,719 B1 | 11/2014 | Venkataraman et al. |
| 8,902,321 B2 | 12/2014 | Venkataraman et al. |
| 2001/0005225 A1 | 6/2001 | Clark et al. |
| 2001/0019621 A1 | 9/2001 | Hanna et al. |
| 2002/0012056 A1 | 1/2002 | Trevino et al. |
| 2002/0027608 A1 | 3/2002 | Johnson et al. |
| 2002/0039438 A1 | 4/2002 | Mori et al. |
| 2002/0063807 A1 | 5/2002 | Margulis |
| 2002/0087403 A1 | 7/2002 | Meyers et al. |
| 2002/0089596 A1 | 7/2002 | Yasuo |
| 2002/0094027 A1 | 7/2002 | Sato et al. |
| 2002/0113867 A1 | 8/2002 | Takigawa et al. |
| 2002/0113888 A1 | 8/2002 | Sonoda et al. |
| 2002/0163054 A1 | 11/2002 | Suda et al. |
| 2002/0167537 A1 | 11/2002 | Trajkovic |
| 2002/0177054 A1 | 11/2002 | Saitoh et al. |
| 2003/0086079 A1 | 5/2003 | Barth et al. |
| 2003/0124763 A1 | 7/2003 | Fan et al. |
| 2003/0179418 A1 | 9/2003 | Wengender et al. |
| 2003/0190072 A1 | 10/2003 | Adkins et al. |
| 2003/0211405 A1 | 11/2003 | Venkataraman |
| 2004/0008271 A1 | 1/2004 | Hagimori et al. |
| 2004/0012689 A1 | 1/2004 | Tinnerino et al. |
| 2004/0047274 A1 | 3/2004 | Amanai |
| 2004/0050104 A1 | 3/2004 | Ghosh et al. |
| 2004/0056966 A1 | 3/2004 | Schechner et al. |
| 2004/0066454 A1 | 4/2004 | Otani et al. |
| 2004/0100570 A1 | 5/2004 | Shizukuishi |
| 2004/0114807 A1 | 6/2004 | Lelescu et al. |
| 2004/0151401 A1 | 8/2004 | Sawhney et al. |
| 2004/0165090 A1 | 8/2004 | Ning |
| 2004/0169617 A1 | 9/2004 | Yelton et al. |
| 2004/0170340 A1 | 9/2004 | Tipping et al. |
| 2004/0174439 A1 | 9/2004 | Upton |
| 2004/0207836 A1 | 10/2004 | Chhibber et al. |
| 2004/0213449 A1 | 10/2004 | Safaee-Rad et al. |
| 2004/0234873 A1 | 11/2004 | Venkataraman |
| 2004/0240052 A1 | 12/2004 | Minefuji et al. |
| 2004/0251509 A1 | 12/2004 | Choi |
| 2004/0264806 A1 | 12/2004 | Herley |
| 2005/0006477 A1 | 1/2005 | Patel |
| 2005/0012035 A1 | 1/2005 | Miller |
| 2005/0036778 A1 | 2/2005 | DeMonte |
| 2005/0047678 A1 | 3/2005 | Jones et al. |
| 2005/0048690 A1 | 3/2005 | Yamamoto |
| 2005/0068436 A1 | 3/2005 | Fraenkel et al. |
| 2005/0132098 A1 | 6/2005 | Sonoda et al. |
| 2005/0134712 A1 | 6/2005 | Gruhlke et al. |
| 2005/0147277 A1 | 7/2005 | Higaki et al. |
| 2005/0151759 A1 | 7/2005 | Gonzalez-Banos et al. |
| 2005/0175257 A1 | 8/2005 | Kuroki |
| 2005/0185711 A1 | 8/2005 | Pfister et al. |
| 2005/0205785 A1 | 9/2005 | Hornback et al. |
| 2005/0219363 A1 | 10/2005 | Kohler |
| 2005/0225654 A1 | 10/2005 | Feldman et al. |
| 2005/0286612 A1 | 12/2005 | Takanashi |
| 2006/0002635 A1 | 1/2006 | Nestares et al. |
| 2006/0023197 A1 | 2/2006 | Joel |
| 2006/0023314 A1 | 2/2006 | Boettiger et al. |

(56) References Cited

U.S. PATENT DOCUMENTS

| | | |
|---|---|---|
| 2006/0034003 A1 | 2/2006 | Zalevsky |
| 2006/0038891 A1 | 2/2006 | Okutomi et al. |
| 2006/0049930 A1 | 3/2006 | Zruya et al. |
| 2006/0054782 A1 | 3/2006 | Olsen et al. |
| 2006/0069478 A1 | 3/2006 | Iwama |
| 2006/0072029 A1 | 4/2006 | Miyatake et al. |
| 2006/0087747 A1 | 4/2006 | Ohzawa et al. |
| 2006/0098888 A1 | 5/2006 | Morishita |
| 2006/0125936 A1 | 6/2006 | Gruhike et al. |
| 2006/0138322 A1 | 6/2006 | Costello et al. |
| 2006/0157640 A1 | 7/2006 | Perlman et al. |
| 2006/0159369 A1 | 7/2006 | Young |
| 2006/0176566 A1 | 8/2006 | Boettiger et al. |
| 2006/0187338 A1 | 8/2006 | May et al. |
| 2006/0197937 A1 | 9/2006 | Bamji et al. |
| 2006/0210186 A1 | 9/2006 | Berkner |
| 2006/0239549 A1 | 10/2006 | Kelly et al. |
| 2006/0243889 A1 | 11/2006 | Farnworth et al. |
| 2006/0251410 A1 | 11/2006 | Trutna |
| 2006/0278948 A1 | 12/2006 | Yamaguchi et al. |
| 2006/0279648 A1 | 12/2006 | Senba et al. |
| 2007/0002159 A1 | 1/2007 | Olsen et al. |
| 2007/0024614 A1 | 2/2007 | Tam |
| 2007/0036427 A1 | 2/2007 | Nakamura et al. |
| 2007/0040828 A1 | 2/2007 | Zalevsky et al. |
| 2007/0040922 A1 | 2/2007 | McKee et al. |
| 2007/0041391 A1 | 2/2007 | Lin et al. |
| 2007/0052825 A1 | 3/2007 | Cho |
| 2007/0083114 A1 | 4/2007 | Yang et al. |
| 2007/0085917 A1 | 4/2007 | Kobayashi |
| 2007/0102622 A1 | 5/2007 | Olsen et al. |
| 2007/0126898 A1 | 6/2007 | Feldman |
| 2007/0127831 A1 | 6/2007 | Venkataraman |
| 2007/0139333 A1 | 6/2007 | Sato et al. |
| 2007/0146511 A1 | 6/2007 | Kinoshita et al. |
| 2007/0158427 A1 | 7/2007 | Zhu et al. |
| 2007/0160310 A1 | 7/2007 | Tanida et al. |
| 2007/0165931 A1 | 7/2007 | Higaki |
| 2007/0171290 A1 | 7/2007 | Kroger |
| 2007/0206241 A1 | 9/2007 | Smith et al. |
| 2007/0211164 A1 | 9/2007 | Olsen et al. |
| 2007/0216765 A1 | 9/2007 | Wong et al. |
| 2007/0257184 A1 | 11/2007 | Olsen et al. |
| 2007/0258006 A1 | 11/2007 | Olsen et al. |
| 2007/0258706 A1 | 11/2007 | Raskar et al. |
| 2007/0268374 A1 | 11/2007 | Robinson |
| 2007/0296835 A1 | 12/2007 | Olsen et al. |
| 2008/0019611 A1 | 1/2008 | Larkin |
| 2008/0025649 A1 | 1/2008 | Liu et al. |
| 2008/0030597 A1 | 2/2008 | Olsen et al. |
| 2008/0043095 A1 | 2/2008 | Vetro et al. |
| 2008/0043096 A1 | 2/2008 | Vetro et al. |
| 2008/0062164 A1 | 3/2008 | Bassi et al. |
| 2008/0079805 A1 | 4/2008 | Takagi et al. |
| 2008/0080028 A1 | 4/2008 | Bakin et al. |
| 2008/0084486 A1 | 4/2008 | Enge et al. |
| 2008/0088793 A1 | 4/2008 | Sverdrup et al. |
| 2008/0112635 A1 | 5/2008 | Kondo et al. |
| 2008/0118241 A1 | 5/2008 | Tekolste et al. |
| 2008/0131019 A1 | 6/2008 | Ng |
| 2008/0151097 A1 | 6/2008 | Chen et al. |
| 2008/0152296 A1 | 6/2008 | Oh et al. |
| 2008/0158259 A1 | 7/2008 | Kempf et al. |
| 2008/0158375 A1 | 7/2008 | Kakkori et al. |
| 2008/0187305 A1 | 8/2008 | Raskar et al. |
| 2008/0218610 A1 | 9/2008 | Chapman et al. |
| 2008/0219654 A1 | 9/2008 | Border et al. |
| 2008/0239116 A1 | 10/2008 | Smith |
| 2008/0240598 A1 | 10/2008 | Hasegawa |
| 2008/0247638 A1 | 10/2008 | Tanida et al. |
| 2008/0247653 A1 | 10/2008 | Moussavi et al. |
| 2008/0272416 A1 | 11/2008 | Yun |
| 2008/0273751 A1 | 11/2008 | Yuan et al. |
| 2008/0278591 A1 | 11/2008 | Barna et al. |
| 2009/0050946 A1 | 2/2009 | Duparre et al. |
| 2009/0052743 A1 | 2/2009 | Techmer |
| 2009/0060281 A1 | 3/2009 | Tanida et al. |
| 2009/0086074 A1 | 4/2009 | Li et al. |
| 2009/0096050 A1 | 4/2009 | Park |
| 2009/0102956 A1 | 4/2009 | Georgiev |
| 2009/0109306 A1 | 4/2009 | Shan et al. |
| 2009/0128833 A1 | 5/2009 | Yahav |
| 2009/0179142 A1 | 7/2009 | Duparre et al. |
| 2009/0180021 A1 | 7/2009 | Kikuchi et al. |
| 2009/0200622 A1 | 8/2009 | Tai et al. |
| 2009/0201371 A1 | 8/2009 | Matsuda et al. |
| 2009/0207235 A1 | 8/2009 | Francini et al. |
| 2009/0225203 A1 | 9/2009 | Tanida et al. |
| 2009/0263017 A1 | 10/2009 | Tanbakuchi |
| 2009/0268192 A1 | 10/2009 | Koenck et al. |
| 2009/0268970 A1 | 10/2009 | Babacan et al. |
| 2009/0274387 A1 | 11/2009 | Jin |
| 2009/0284651 A1 | 11/2009 | Srinivasan |
| 2009/0297056 A1 | 12/2009 | Lelescu et al. |
| 2009/0302205 A9 | 12/2009 | Olsen et al. |
| 2009/0323195 A1 | 12/2009 | Hembree et al. |
| 2009/0323206 A1 | 12/2009 | Oliver et al. |
| 2009/0324118 A1 | 12/2009 | Maslov et al. |
| 2010/0002126 A1 | 1/2010 | Wenstrand et al. |
| 2010/0002313 A1 | 1/2010 | Duparre et al. |
| 2010/0002314 A1 | 1/2010 | Duparre |
| 2010/0013927 A1 | 1/2010 | Nixon |
| 2010/0053342 A1 | 3/2010 | Hwang et al. |
| 2010/0053600 A1 | 3/2010 | Tanida et al. |
| 2010/0060746 A9 | 3/2010 | Olsen et al. |
| 2010/0074532 A1 | 3/2010 | Gordon et al. |
| 2010/0085425 A1 | 4/2010 | Tan |
| 2010/0086227 A1 | 4/2010 | Sun et al. |
| 2010/0097491 A1 | 4/2010 | Farina et al. |
| 2010/0103259 A1 | 4/2010 | Tanida et al. |
| 2010/0103308 A1 | 4/2010 | Butterfield et al. |
| 2010/0118127 A1 | 5/2010 | Nam et al. |
| 2010/0142839 A1 | 6/2010 | Lakus-Becker |
| 2010/0157073 A1 | 6/2010 | Kondo et al. |
| 2010/0177411 A1 | 7/2010 | Hegde et al. |
| 2010/0195716 A1 | 8/2010 | Klein et al. |
| 2010/0201834 A1 | 8/2010 | Maruyama et al. |
| 2010/0208100 A9 | 8/2010 | Olsen et al. |
| 2010/0220212 A1 | 9/2010 | Perlman et al. |
| 2010/0231285 A1 | 9/2010 | Boomer et al. |
| 2010/0244165 A1 | 9/2010 | Lake et al. |
| 2010/0265385 A1 | 10/2010 | Knight et al. |
| 2010/0281070 A1 | 11/2010 | Chan et al. |
| 2010/0302423 A1 | 12/2010 | Adams, Jr. et al. |
| 2011/0032370 A1 | 2/2011 | Ludwig |
| 2011/0043661 A1 | 2/2011 | Podoleanu |
| 2011/0043665 A1 | 2/2011 | Ogasahara |
| 2011/0043668 A1 | 2/2011 | McKinnon et al. |
| 2011/0069189 A1 | 3/2011 | Venkataraman et al. |
| 2011/0080487 A1 | 4/2011 | Venkataraman et al. |
| 2011/0108708 A1 | 5/2011 | Olsen et al. |
| 2011/0121421 A1* | 5/2011 | Charbon et al. ............ 257/432 |
| 2011/0122308 A1 | 5/2011 | Duparre |
| 2011/0153248 A1 | 6/2011 | Gu et al. |
| 2011/0211824 A1 | 9/2011 | Georgiev et al. |
| 2011/0221599 A1 | 9/2011 | Högasten |
| 2011/0221658 A1 | 9/2011 | Haddick et al. |
| 2011/0234841 A1 | 9/2011 | Akeley et al. |
| 2011/0241234 A1 | 10/2011 | Duparre |
| 2011/0255745 A1 | 10/2011 | Hodder et al. |
| 2011/0273531 A1 | 11/2011 | Ito et al. |
| 2011/0274366 A1 | 11/2011 | Tardif |
| 2011/0279721 A1 | 11/2011 | McMahon |
| 2011/0285866 A1 | 11/2011 | Bhrugumalla et al. |
| 2011/0300929 A1 | 12/2011 | Tardif et al. |
| 2011/0310980 A1 | 12/2011 | Mathew |
| 2011/0317766 A1 | 12/2011 | Lim et al. |
| 2012/0012748 A1 | 1/2012 | Pain et al. |
| 2012/0026342 A1 | 2/2012 | Yu et al. |
| 2012/0039525 A1 | 2/2012 | Tian et al. |
| 2012/0044249 A1 | 2/2012 | Mashitani et al. |
| 2012/0069235 A1 | 3/2012 | Imai |
| 2012/0105691 A1 | 5/2012 | Waqas et al. |
| 2012/0113413 A1 | 5/2012 | Miahczylowicz-Wolski et al. |

(56) References Cited

U.S. PATENT DOCUMENTS

| | | |
|---|---|---|
| 2012/0147205 A1 | 6/2012 | Lelescu et al. |
| 2012/0153153 A1 | 6/2012 | Chang et al. |
| 2012/0176479 A1 | 7/2012 | Mayhew et al. |
| 2012/0198677 A1 | 8/2012 | Duparre |
| 2012/0200734 A1 | 8/2012 | Tang |
| 2012/0249550 A1 | 10/2012 | Akeley et al. |
| 2012/0262607 A1 | 10/2012 | Shimura et al. |
| 2012/0287291 A1 | 11/2012 | McMahon |
| 2012/0293695 A1 | 11/2012 | Tanaka |
| 2012/0314033 A1 | 12/2012 | Lee et al. |
| 2012/0327222 A1 | 12/2012 | Ng et al. |
| 2013/0003184 A1 | 1/2013 | Duparre |
| 2013/0010073 A1 | 1/2013 | Do et al. |
| 2013/0022111 A1 | 1/2013 | Chen et al. |
| 2013/0027580 A1 | 1/2013 | Olsen et al. |
| 2013/0033579 A1 | 2/2013 | Wajs |
| 2013/0050504 A1 | 2/2013 | Safaee-Rad et al. |
| 2013/0050526 A1 | 2/2013 | Keelan |
| 2013/0070060 A1* | 3/2013 | Chatterjee et al. .............. 348/47 |
| 2013/0077880 A1 | 3/2013 | Venkataraman et al. |
| 2013/0077882 A1 | 3/2013 | Venkataraman et al. |
| 2013/0088637 A1 | 4/2013 | Duparre |
| 2013/0128087 A1* | 5/2013 | Georgiev et al. .............. 348/307 |
| 2013/0147979 A1 | 6/2013 | McMahon et al. |
| 2013/0215108 A1 | 8/2013 | McMahon et al. |
| 2013/0229540 A1 | 9/2013 | Farina et al. |
| 2013/0259317 A1 | 10/2013 | Gaddy |
| 2013/0265459 A1 | 10/2013 | Duparre et al. |
| 2014/0076336 A1 | 3/2014 | Clayton et al. |
| 2014/0079336 A1 | 3/2014 | Venkataraman et al. |
| 2014/0092281 A1 | 4/2014 | Nisenzon et al. |
| 2014/0118493 A1 | 5/2014 | Sali et al. |
| 2014/0132810 A1 | 5/2014 | McMahon |
| 2014/0176592 A1 | 6/2014 | Wilburn et al. |
| 2014/0218546 A1 | 8/2014 | McMahon |
| 2014/0232822 A1 | 8/2014 | Venkataraman et al. |
| 2014/0253738 A1 | 9/2014 | Mullis |
| 2014/0267243 A1 | 9/2014 | Venkataraman et al. |
| 2014/0267286 A1 | 9/2014 | Duparre |
| 2014/0267633 A1 | 9/2014 | Venkataraman et al. |
| 2014/0285675 A1 | 9/2014 | Mullis |
| 2014/0321712 A1 | 10/2014 | Ciurea et al. |
| 2014/0333731 A1 | 11/2014 | Venkataraman et al. |
| 2014/0333764 A1 | 11/2014 | Venkataraman et al. |
| 2014/0333787 A1 | 11/2014 | Venkataraman et al. |
| 2014/0340539 A1 | 11/2014 | Venkataraman et al. |
| 2014/0347509 A1 | 11/2014 | Venkataraman et al. |
| 2014/0354773 A1 | 12/2014 | Venkataraman et al. |
| 2014/0354843 A1 | 12/2014 | Venkataraman et al. |
| 2014/0354844 A1 | 12/2014 | Venkataraman et al. |
| 2014/0354853 A1 | 12/2014 | Venkataraman et al. |
| 2014/0354854 A1 | 12/2014 | Venkataraman et al. |
| 2014/0354855 A1 | 12/2014 | Venkataraman et al. |
| 2014/0355870 A1 | 12/2014 | Venkataraman et al. |
| 2014/0368662 A1 | 12/2014 | Venkataraman et al. |
| 2014/0368683 A1 | 12/2014 | Venkataraman et al. |
| 2014/0368684 A1 | 12/2014 | Venkataraman et al. |
| 2014/0368685 A1 | 12/2014 | Venkataraman et al. |
| 2014/0369612 A1 | 12/2014 | Venkataraman et al. |
| 2014/0369615 A1 | 12/2014 | Venkataraman et al. |
| 2014/0376825 A1 | 12/2014 | Venkataraman et al. |
| 2014/0376826 A1 | 12/2014 | Venkataraman et al. |
| 2015/0003752 A1 | 1/2015 | Venkataraman et al. |
| 2015/0003753 A1 | 1/2015 | Venkataraman et al. |
| 2015/0009353 A1 | 1/2015 | Venkataraman et al. |
| 2015/0009354 A1 | 1/2015 | Venkataraman et al. |
| 2015/0009362 A1 | 1/2015 | Venkataraman et al. |
| 2015/0015669 A1 | 1/2015 | Venkataraman et al. |
| 2015/0036014 A1 | 2/2015 | Lelescu et al. |
| 2015/0036015 A1 | 2/2015 | Lelescu et al. |
| 2015/0042766 A1 | 2/2015 | Ciurea et al. |
| 2015/0042767 A1 | 2/2015 | Ciurea et al. |
| 2015/0042833 A1 | 2/2015 | Lelescu et al. |
| 2015/0049915 A1 | 2/2015 | Ciurea et al. |
| 2015/0049916 A1 | 2/2015 | Ciurea et al. |
| 2015/0049917 A1 | 2/2015 | Ciurea et al. |
| 2015/0055884 A1 | 2/2015 | Venkataraman et al. |

FOREIGN PATENT DOCUMENTS

| | | |
|---|---|---|
| JP | 2006033493 A | 2/2006 |
| JP | 2007520107 A | 7/2007 |
| JP | 2011109484 A | 6/2011 |
| KR | 1020110097647 A | 8/2011 |
| WO | 2007083579 A1 | 7/2007 |
| WO | 2011063347 A2 | 5/2011 |
| WO | 2011116203 A1 | 9/2011 |
| WO | 2011/063347 A3 | 10/2011 |
| WO | 2011143501 A1 | 11/2011 |
| WO | 2012057619 A1 | 5/2012 |
| WO | 2012057620 A2 | 5/2012 |
| WO | 2012057621 A1 | 5/2012 |
| WO | 2012057622 A1 | 5/2012 |
| WO | 2012057623 A1 | 5/2012 |
| WO | 2012057620 A3 | 6/2012 |
| WO | 2012074361 A1 | 6/2012 |
| WO | 2012078126 A1 | 6/2012 |
| WO | 2012082904 A1 | 6/2012 |
| WO | 2013003276 A1 | 1/2013 |
| WO | 2013043751 A1 | 3/2013 |
| WO | 2013043761 A1 | 3/2013 |
| WO | 2013049699 A1 | 4/2013 |
| WO | 2013055960 A1 | 4/2013 |
| WO | 2013119706 A1 | 8/2013 |
| WO | 2013126578 A1 | 8/2013 |
| WO | 2014032020 A3 | 5/2014 |
| WO | 2014078443 A1 | 5/2014 |
| WO | 2014130849 A1 | 8/2014 |
| WO | 2014138695 A1 | 9/2014 |
| WO | 2014138697 A1 | 9/2014 |
| WO | 2014144157 A1 | 9/2014 |
| WO | 2014145856 A1 | 9/2014 |
| WO | 2014150856 A1 | 9/2014 |
| WO | 2014159721 A1 | 10/2014 |
| WO | 2014159779 A1 | 10/2014 |
| WO | 2014160142 A1 | 10/2014 |
| WO | 2014164550 A2 | 10/2014 |
| WO | 2014165244 A1 | 10/2014 |

OTHER PUBLICATIONS

International Search Report and Written Opinion for International Application No. PCT/US13/48772, Search Completed Oct. 21, 2013, Mailed Nov. 8, 2013, 6 pgs.

International Search Report and Written Opinion for International Application No. PCT/US13/56065, Search Completed Nov. 25, 2013, Mailed Nov. 26, 2013, 8 pgs.

International Search Report and Written Opinion for International Application No. PCT/US13/59991, Search Completed Feb. 6, 2014, Mailed Feb. 26, 2014, 8 pgs.

International Search Report and Written Opinion for International Application No. PCT/US2013/024987, Search Completed Mar. 27, 2013, Mailed Apr. 15, 2013, 14 pgs.

International Search Report and Written Opinion for International Application No. PCT/US2013/056502, Search Completed Feb. 18, 2014, Mailed Mar. 19, 2014, 7 pgs.

International Search Report and Written Opinion for International Application No. PCT/US2013/069932, Search Completed Mar. 14, 2014, Mailed Apr. 14, 2014, 12 pgs.

International Search Report and Written Opinion for International Application PCT/US11/36349, mailed Aug. 22, 2011, 12 pgs.

International Search Report and Written Opinion for International Application No. PCT/US2011/64921, Report Completed Feb. 25, 2011, mailed Mar. 6, 2012, 17 pgs.

International Search Report and Written Opinion for International Application No. PCT/US2013/027146, completed Apr. 2, 2013, 12 pgs.

International Search Report and Written Opinion for International Application PCT/US2009/044687, completed Jan. 5, 2010, 13 pgs.

(56) References Cited

OTHER PUBLICATIONS

International Search Report and Written Opinion for International Application PCT/US2010/057661, completed Mar. 9, 2011, 14 pgs.
International Search Report and Written Opinion for International Application PCT/US2012/044014, completed Oct. 12, 2012, 15 pgs.
International Search Report and Written Opinion for International Application PCT/US2012/056151, completed Nov. 14, 2012, 10 pgs.
International Search Report and Written Opinion for International Application PCT/US2012/059813, completed Dec. 17, 2012, 8 pgs.
International Search Report and Written Opinion for International Application PCT/US12/37670, Mailed Jul. 18, 2012, Search Completed Jul. 5, 2012, 9 pgs.
International Search Report and Written Opinion for International Application PCT/US2012/58093, completed Nov. 15, 2012, 12 pgs.
Office Action for U.S. Appl. No. 12/952,106, dated Aug. 16, 2012, 12 pgs.
Baker et al., "Limits on Super-Resolution and How to Break Them", IEEE Transactions on Pattern Analysis and Machine Intelligence, Sep. 2002, vol. 24, No. 9, pp. 1167-1183.
Bertero et al., "Super-resolution in computational imaging", Micron, 2003, vol. 34, Issues 6-7, 17 pgs.
Bishop et al., "Full-Resolution Depth Map Estimation from an Aliased Plenoptic Light Field", ACCV 2010, Part II, LNCS 6493, pp. 186-200, 2011.
Kang et al., "Handling Occlusions inn Dense Multi-View Stereo", Computer Vision and Pattern Recognition, 2001, vol. 1, pp. I-103-I-110.
Kitamura et al., "Reconstruction of a high-resolution image on a compound-eye image-capturing system", Applied Optics, Mar. 10, 2004, vol. 43, No. 8, pp. 1719-1727.
Krishnamurthy et al., "Compression and Transmission of Depth Maps for Image-Based Rendering", Image Processing, 2001, pp. 828-831.
Kutulakos et al., "Occluding Contour Detection Using Affine Invariants and Purposive Viewpoint Control", Proc., CVPR 94, 8 pgs.
Lensvector, "How LensVector Autofocus Works", http://www.lensvector.com/overview.html.
Levoy, "Light Fields and Computational Imaging", IEEE Computer Society, Aug. 2006, pp. 46-55.
Levoy et al., "Light Field Rendering", Proc. ADM SIGGRAPH '96, pp. 1-12.
Li et al., "A Hybrid Camera for Motion Deblurring and Depth Map Super-Resolution," Jun. 23-28, 2008, IEEE Conference on Computer Vision and Pattern Recognition, 8 pgs. Retrieved from www.eecis.udel.edu/~jye/lab_research/08/deblur-feng.pdf on Feb. 5, 2014.
Liu et al., "Virtual View Reconstruction Using Temporal Information", 2012 IEEE International Conference on Multimedia and Expo, 2012, pp. 115-120.
Muehlebach, "Camera Auto Exposure Control for VSLAM Applications", Studies on Mechatronics.
Nayar, "Computational Cameras: Redefining the Image", IEEE Computer Society, Aug. 2006, pp. 30-38.
Ng, "Digital Light Field Photography", Thesis, Jul. 2006, 203 pgs.
Ng et al., "Super-Resolution Image Restoration from Blurred Low-Resolution Images", Journal of Mathematical Imaging and Vision, 2005, vol. 23, pp. 367-378.
Nitta et al., "Image reconstruction for thin observation module by bound optics by using the iterative backprojection method", Applied Optics, May 1, 2006, vol. 45, No. 13, pp. 2893-2900.
Nomura et al., "Scene Collages and Flexible Camera Arrays", Proceedings of Eurographics Symposium on Rendering, 2007, 12 pgs.
Park et al., "Super-Resolution Image Reconstruction", IEEE Signal Processing Magazine, May 2003, pp. 21-36.
Pham et al., "Robust Super-Resolution without Regularization", Journal of Physics: Conference Series 124, 2008, pp. 1-19.
Polight, "Designing Imaging Products Using Reflowable Autofocus Lenses", http://www.polight.no/tunable-polymer-autofocus-lens-html—11.html.

Protter et al., "Generalizing the Nonlocal-Means to Super-Resolution Reconstruction", IEEE Transactions on Image Processing, Jan. 2009, vol. 18, No. 1, pp. 36-51.
Radtke et al., "Laser lithographic fabrication and characterization of a spherical artificial compound eye", Optics Express, Mar. 19, 2007, vol. 15, No. 6, pp. 3067-3077.
Rander et al., "Virtualized Reality: Constructing Time-Varying Virtual Worlds From Real World Events", Proc. of IEEE Visualization '97, Phoenix, Arizona, Oct. 19-24, 1997, pp. 277-283, 552.
Rhemann et al, "Fast Cost-Volume Filtering for Visual Correspondence and Beyond", IEEE Trans. Pattern Anal. Mach. Intell, 2013, vol. 35, No. 2, pp. 504-511.
Robertson et al., "Dynamic Range Improvement Through Multiple Exposures", in Proc. of the Int. Conf. on Image Processing, 1999, 5 pgs.
Robertson et al., "Estimation-theoretic approach to dynamic range enhancement using multiple exposures", Journal of Electronic Imaging, Apr. 2003, vol. 12, No. 2, pp. 219-228.
Roy et al., "Non-Uniform Hierarchical Pyramid Stereo for Large Images", Computer and Robot Vision, 2007, pp. 208-215.
Sauer et al., "Parallel Computation of Sequential Pixel Updates in Statistical Tomographic Reconstruction", ICIP 1995, pp. 93-96.
Shum et al., "Pop-Up Light Field: An Interactive Image-Based Modeling and Rendering System," Apr. 2004, ACM Transactions on Graphics, vol. 23, No. 2, pp. 143-162. Retrieved from http://131.107.65.14/en-us/um/people/jiansun/papers/PopupLightField_TOG.pdf on Feb. 5.
Stollberg et al., "The Gabor superlens as an alternative wafer-level camera approach inspired by superposition compound eyes of nocturnal insects", Optics Express, Aug. 31, 2009, vol. 17, No. 18, pp. 15747-15759.
Sun et al., "Image Super-Resolution Using Gradient Profile Prior", Source and date unknown, 8 pgs.
Takeda et al., "Super-resolution Without Explicit Subpixel Motion Estimation", IEEE Transaction on Image Processing, Sep. 2009, vol. 18, No. 9, pp. 1958-1975.
Tanida et al., "Color imaging with an integrated compound imaging system", Optics Express, Sep. 8, 2003, vol. 11, No. 18, pp. 2109-2117.
Tanida et al., "Thin observation module by bound optics (TOMBO): concept and experimental verification", Applied Optics, Apr. 10, 2001, vol. 40, No. 11, pp. 1806-1813.
Taylor, "Virtual camera movement: The way of the future?", American Cinematographer 77, 9 (Sept.), 93-100.
Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.
Vaish et al., "Synthetic Aperture Focusing Using a Shear-Warp Factorization of the Viewing Transform", IEEE Workshop on A3DISS, CVPR, 2005, 8 pgs.
Vaish et al., "Using Plane + Parallax for Calibrating Dense Camera Arrays", IEEE Conference on Computer Vision and Pattern Recognition (CVPR), 2004, 8 pgs.
Vuong et al., "A New Auto Exposure and Auto White-Balance Algorithm to Detect High Dynamic Range Conditions Using CMOS Technology".
Wang, "Calculation of Image Position, Size and Orientation Using First Order Properties".
Wetzstein et al., "Computational Plenoptic Imaging", Computer Graphics Forum, 2011, vol. 30, No. 8, pp. 2397-2426.
Wheeler et al., "Super-Resolution Image Synthesis Using Projections Onto Convex Sets in the Frequency Domain", Proc. SPIE, 2005, 5674, 12 pgs.
Wikipedia, "Polarizing Filter (Photography)".
Wilburn, "High Performance Imaging Using Arrays of Inexpensive Cameras", Thesis of Bennett Wilburn, Dec. 2004, 128 pgs.
Wilburn et al., "High Performance Imaging Using Large Camera Arrays", ACM Transactions on Graphics, Jul. 2005, vol. 24, No. 3, pp. 765-776.

(56) References Cited

OTHER PUBLICATIONS

Wilburn et al., "High-Speed Videography Using a Dense Camera Array", Proceeding, CVPR'04 Proceedings of the 2004 IEEE Computer Society Conference on Computer Vision and Pattern Recognition, pp. 294-301.
Wilburn et al., "The Light Field Video Camera", Proceedings of Media Processors 2002, SPIE Electronic Imaging, 2002, 8 pgs.
Wippermann et al., "Design and fabrication of a chirped array of refractive ellipsoidal micro-lenses for an apposition eye camera objective", Proceedings of SPIE, Optical Design and Engineering II, Oct. 15, 2005, 59622C-1-59622C-11.
Yang et al., "A Real-Time Distributed Light Field Camera", Eurographics Workshop on Rendering (2002)pp. 1-10.
Yang et al., "Superresolution Using Preconditioned Conjugate Gradient Method", Source and date unknown, 8 pgs.
Zhang et al., "A Self-Reconfigurable Camera Array", Eurographics Symposium on Rendering, 2004, 12 pgs.
Zomet et al., "Robust Super-Resolution", IEEE, 2001, pp. 1-6.
Bishop et al., "Light Field Superresolution", Retrieved from http://home.eps.hw.ac.uk/~sz73/ICCP09/LightFieldSuperresolution.pdf, 9 pgs.
Bishop et al., "The Light Field Camera: Extended Depth of Field, Aliasing, and Superresolution", IEEE Transactions on Pattern Analysis and Machine Intelligence, May 2012, vol. 34, No. 5, pp. 972-986.
Borman, "Topics in Multiframe Superresolution Restoration", Thesis of Sean Borman, Apr. 2004, 282 pgs.
Borman et al, "Image Sequence Processing", Source unknown, Oct. 14, 2002, 81 pgs.
Borman et al., "Block-Matching Sub-Pixel Motion Estimation from Noisy, Under-Sampled Frames—An Empirical Performance Evaluation", Proc SPIE, Dec. 1998, 3653, 10 pgs.
Borman et al., "Image Resampling and Constraint Formulation for Multi-Frame Super-Resolution Restoration", Proc. SPIE, Jun. 2003, 5016, 12 pgs.
Borman et al., "Linear models for multi-frame super-resolution restoration under non-affine registration and spatially varying PSF", Proc. SPIE, May 2004, vol. 5299, 12 pgs.
Borman et al., "Nonlinear Prediction Methods for Estimation of Clique Weighting Parameters in NonGaussian Image Models", Proc. SPIE, 1998. 3459, 9 pgs.
Borman et al., "Simultaneous Multi-Frame MAP Super-Resolution Video Enhancement Using Spatio-Temporal Priors", Image Processing, 1999, ICIP 99 Proceedings, vol. 3, pp. 469-473.
Borman et al., "Super-Resolution from Image Sequences—A Review", Circuits & Systems, 1998, pp. 374-378.
Bose et al., "Superresolution and Noise Filtering Using Moving Least Squares", IEEE Transactions on Image Processing, date unknown, 21 pgs.
Boye et al., "Comparison of Subpixel Image Registration Algorithms", Proc. of SPIE-IS&T Electronic Imaging, vol. 7246, pp. 72460X-1-72460X-9.
Bruckner et al., "Artificial compound eye applying hyperacuity", Optics Express, Dec. 11, 2006, vol. 14, No. 25, pp. 12076-12084.
Bruckner et al., "Driving microoptical imaging systems towards miniature camera applications", Proc. SPIE, Micro-Optics, 2010, 11 pgs.
Bruckner et al., "Thin wafer-level camera lenses inspired by insect compound eyes", Optics Express, Nov. 22, 2010, vol. 18, No. 24, pp. 24379-24394.
Capel, "Image Mosaicing and Super-resolution", [online], Retrieved on Nov. 10, 2012. Retrieved from the Internet at URL:<http://citeseerx.ist.psu.edu/viewdoc/download?doi=10.1.1.226.2643&rep=repl&type=pdf>, Title pg., abstract, table of contents, pp. 1-263 (269 total pages).
Chan et al., "Extending the Depth of Field in a Compound-Eye Imaging System with Super-Resolution Reconstruction", Proceedings—International Conference on Pattern Recognition, 2006, vol. 3, pp. 623-626.
Chan et al., "Investigation of Computational Compound-Eye Imaging System with Super-Resolution Reconstruction", IEEE, ISASSP 2006, pp. 1177-1180.
Chan et al., "Super-resolution reconstruction in a computational compound-eye imaging system", Multidim. Syst. Sign Process, 2007, vol. 18, pp. 83-101.
Drouin et al., "Fast Multiple-Baseline Stereo with Occlusion", Proceedings of the Fifth International Conference on 3-D Digital Imaging and Modeling, 2005, 8 pgs.
Drouin et al., "Geo-Consistency for Wide Multi-Camera Stereo", Proceedings of the 2005 IEEE Computer Society Conference on Computer Vision and Pattern Recognition, 2005, 8 pgs.
Drouin et al., "Improving Border Localization of Multi-Baseline Stereo Using Border-Cut", International Journal of Computer Vision, Jul. 2009, vol. 83, Issue 3, 8 pgs.
Duparre et al., "Artificial apposition compound eye fabricated by micro-optics technology", Applied Optics, Aug. 1, 2004, vol. 43, No. 22, pp. 4303-4310.
Duparre et al., "Artificial compound eye zoom camera", Bioinspiration & Biomimetics, 2008, vol. 3, pp. 1-6.
Duparre et al., "Artificial compound eyes—different concepts and their application to ultra flat image acquisition sensors", MOEMS and Miniaturized Systems IV, Proc. SPIE 5346, Jan. 2004, pp. 89-100.
Duparre et al., "Chirped arrays of refractive ellipsoidal microlenses for aberration correction under oblique incidence", Optics Express, Dec. 26, 2005, vol. 13, No. 26, pp. 10539-10551.
Duparre et al., "Micro-optical artificial compound eyes", Bioinspiration & Biomimetics, 2006, vol. 1, pp. R1-R16.
Duparre et al., "Microoptical artificial compound eyes—from design to experimental verification of two different concepts", Proc. of SPIE, Optical Design and Engineering II, vol. 5962, pp. 59622A-1-59622A-12.
Duparre et al., "Microoptical Artificial Compound Eyes—Two Different Concepts for Compact Imaging Systems", 11th Microoptics Conference, Oct. 30-Nov. 2, 2005, 2 pgs.
Duparre et al., "Microoptical telescope compound eye", Optics Express, Feb. 7, 2005, vol. 13, No. 3, pp. 889-903.
Duparre et al., "Micro-optically fabricated artificial apposition compound eye", Electronic Imaging—Science and Technology, Prod. SPIE 5301, Jan. 2004, pp. 25-33.
Duparre et al., "Novel Optics/Micro-Optics for Miniature Imaging Systems", Proc. of SPIE, 2006, vol. 6196, pp. 619607-1-619607-15.
Duparre et al., "Theoretical analysis of an artificial superposition compound eye for application in ultra flat digital image acquisition devices", Optical Systems Design, Proc. SPIE 5249, Sep. 2003, pp. 408-418.
Duparre et al., "Thin compound-eye camera", Applied Optics, May 20, 3005, vol. 44, No. 15, pp. 2949-2956.
Duparre et al., "Ultra-Thin Camera Based on Artificial Apposistion Compound Eyes", 10th Microoptics Conference, Sep. 1-3, 2004, 2 pgs.
Fanaswala, "Regularized Super-Resolution of Multi-View Images", Retrieved on Nov. 2012. Retrieved from the Internet at URL:<http://www.site.uottawa.ca/-edubois/theses/Fanaswala_thesis.pdf>, 163 pgs.
Farrell et al., "Resolution and Light Sensitivity Tradeoff with Pixel Size", Proceedings of the SPIE Electronic Imaging 2006 Conference, 2006, vol. 6069, 8 pgs.
Farsiu et al., "Advances and Challenges in Super-Resolution", International Journal of Imaging Systems and Technology, 2004, vol. 14, pp. 47-57.
Farsiu et al., "Fast and Robust Multiframe Super Resolution", IEEE Transactions on Image Processing, Oct. 2004, vol. 13, No. 10, pp. 1327-1344.
Farsiu et al., "Multiframe Demosaicing and Super-Resolution of Color Images", IEEE Transactions on Image Processing, Jan. 2006, vol. 15, No. 1, pp. 141-159.
Feris et al., "Multi-Flash Stereopsis: Depth Edge Preserving Stereo with Small Baseline Illumination", IEEE Trans on PAMI, 2006, 31 pgs.
Fife et al., "A 3D Multi-Aperture Image Sensor Architecture", Custom Integrated Circuits Conference, 2006, CICC '06, IEEE, pp. 281-284.

(56) References Cited

OTHER PUBLICATIONS

Fife et al., "A 3MPixel Multi-Aperture Image Sensor with 0.7Mu Pixels in 0.11Mu CMOS", ISSCC 2008, Session 2, Image Sensors & Technology, 2008, pp. 48-50.
Fischer et al., Optical System Design, 2nd Edition, SPIE Press, pp. 191-198.
Fischer et al., Optical System Design, 2nd Edition, SPIE Press, pp. 49-58.
Hamilton, "JPEG File Interchange Format, Version 1.02", Sep. 1, 1992, 9 pgs.
Hardie, "A Fast Image Super-Algorithm Using an Adaptive Wiener Filter", IEEE Transactions on Image Processing, Dec. 2007, vol. 16, No. 12, pp. 2953-2964.
Horisaki et al., "Irregular Lens Arrangement Design to Improve Imaging Performance of Compound-Eye Imaging Systems", Applied Physics Express, 2010, vol. 3, pp. 022501-1-022501-3.
Horisaki et al., "Superposition Imaging for Three-Dimensionally Space-Invariant Point Spread Functions", Applied Physics Express, 2011, vol. 4, pp. 112501-1-112501-3.
US 8,957,977, 02/2015, Venkataraman et al. (withdrawn).
US 8,964,053, 02/2015, Venkataraman et al. (withdrawn).
US 8,965,058, 02/2015, Venkataraman et al. (withdrawn).
Extended European Search Report for European Application EP12835041.0, Report Completed Jan. 28, 2015, Mailed Feb. 4, 2015, 6 Pgs.
International Preliminary Report on Patentability for International Application PCT/US2013/056065, Report Issued Feb. 24, 2015, Mailed Mar. 5, 2015, 4 Pgs.
International Preliminary Report on Patentability for International Application PCT/US2013/056502, Report Issued Feb. 24, 2015, Mailed Mar. 5, 2015, 7 Pgs.
Chen et al., "KNN Matting", IEEE Transactions on Pattern Analysis and Machine Intelligence, Sep. 2013, vol. 35, No. 9, pp. 2175-2188.
Lai et al., "A Large-Scale Hierarchical Multi-View RGB-D Object Dataset", source and date unknown, 8 pgs.
Levin et al., "A Closed Form Solution to Natural Image Matting", Pattern Analysis and Machine Intelligence, Feb. 2008, vol. 30, 8 pgs.
Perwass et al., "Single Lens 3D-Camera with Extended Depth-of-Field", printed from www.raytrix.de, 15 pgs.
Tallon et al., "Upsampling and Denoising of Depth Maps Via Joint-Segmentation", 20th European Signal Processing Conference, Aug. 27-31, 2012, 5 pgs.
Zhang, Qiang et al., "Depth estimation, spatially variant image registration, and super-resolution using a multi-lenslet camera", Proceedings of SPIE, vol. 7705, Apr. 23, 2010, pp. 770505-770505-8, XP055113797 ISSN: 0277-786X, DOI: 10.1117/12.852171.
International Search Report and Written Opinion for International Application PCT/US14/024903 report completed Jun. 12, 2014, Mailed, Jun. 27, 2014, 13 pgs.
International Search Report and Written Opinion for International Application PCT/US14/17766, report completed May 28, 2014, 9 Pgs.
International Search Report and Written Opinion for International Application PCT/US14/18084, Report completed May 23, 2014, Mailed Jun. 10, 2014, 12 pgs.
International Search Report and Written Opinion for International Application PCT/US14/18116, report completed May 13, 2014, Mailed Jun. 2, 2014, 6 Pgs.
International Search Report and Written Opinion for International Application PCT/US14/22118, report completed Jun. 9, 2014, Mailed, Jun. 25, 2014, 5 pgs.
International Search Report and Written Opinion for International Application PCT/US14/24407, report completed Jun. 11, 2014, Mailed Jul. 8, 2014, 9 Pgs.
International Search Report and Written Opinion for International Application PCT/US14/25100, report completed Jul. 7, 2014, Mailed Aug. 7, 2014 5 Pgs.
International Search Report and Written Opinion for International Application PCT/US2014/022123, report completed Jun. 9, 2014, Mailed Jun. 25, 2014, 5 pgs.
International Search Report and Written Opinion for International Application PCT/US2014/024947, Report Completed Jul. 8, 2014, Mailed Aug. 5, 2014, 8 Pgs.
International Search Report and Written Opinion for International Application PCT/US2014/030692, report completed Jul. 28, 2014, Mailed Aug. 27, 2014, 7 Pages.
Chen et al., "Interactive deformation of light fields", In Proceedings of SIGGRAPH 13D 2005, pp. 139-146.
Goldman et al., "Video Object Annotation, Navigation, and Composition", In Proceedings of UIST 2008, pp. 3-12.
Gortler et al., "The Lumigraph", In Proceedings of SIGGRAPH 1996, pp. 43-54.
Hasinoff et al., "Search-and-Replace Editing for Personal Photo Collections", Computational Photography (ICCP) 2010, pp. 1-8.
Horn et al., "LightShop: Interactive Light Field Manipulation and Rendering", In Proceedings of I3D 2007, pp. 121-128.
Isaksen et al., "Dynamically Reparameterized Light Fields", In Proceedings of SIGGRAPH 2000, pp. 297-306.
Joshi, et al., "Synthetic Aperture Tracking: Tracking Through Occlusions", I CCV IEEE 11th International Conference on Computer Vision; Publication [online]. Oct. 2007 [retrieved Jul. 28, 2014]. Retrieved from the Internet: <URL: http:l/ieeexplore.ieee.org/stamp/stamp.jsp?tp=&arnumber=4409032&isnumber=4408819>; pp. 1-8.
Lo et al., "Stereoscopic 3D Copy & Paste", ACM Transactions on Graphics, vol. 29, No. 6, Article 147, Dec. 2010, pp. 147:1-147:10.
Seitz et al., "Plenoptic Image Editing", International Journal of Computer Vision 48, 2, pp. 115-129.
International Search Report and Written Opinion for International Application PCT/US2014/066229, Report Completed Mar. 6, 2015, Mailed Mar. 19, 2015, 9 Pgs.

\* cited by examiner

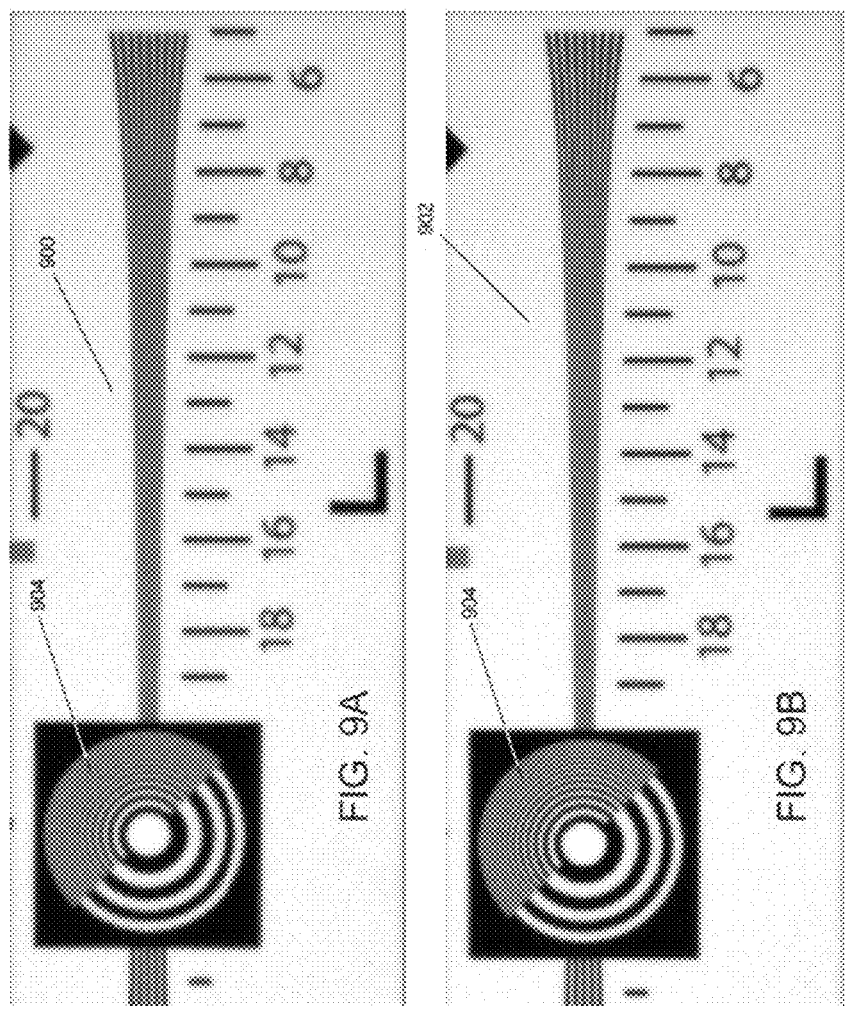

SYSTEMS AND METHODS FOR CONTROLLING ALIASING IN IMAGES CAPTURED BY AN ARRAY CAMERA FOR USE IN SUPER-RESOLUTION PROCESSING

FIELD OF THE INVENTION

The present invention relates to super-resolution processing and more specifically to controlling aliasing in an array camera during super-resolution processing.

BACKGROUND

In a typical imaging device, light enters through an opening (aperture) at one end of the imaging device and is directed to an image sensor by one or more optical elements such as lenses. The image sensor includes pixels that generate signals upon receiving light via the optical element. Commonly used image sensors include charge-coupled device image sensors (CCDs) and complementary metal-oxide semiconductor (CMOS) sensors.

Conventional digital cameras typically achieve color separation by performing color separation in the optical path and using a separate image sensor for the wavelengths of light corresponding to each of the primary colors (i.e. RGB), using an image sensor with color separation and multiple signal collection capability within each pixel, or by applying filters over a single sensor so that individual pixels detect wavelengths of light corresponding to one of the primary colors. Use of filters is particularly common in cameras that have a small form factor, such as cameras incorporated in mobile phone handsets and other consumer electronics devices including but not limited to, laptop computers and televisions. A common filter that is formed on image sensors is the Bayer filter, the pattern of which includes 50% green filters, 25% red filters, and 25% blue filters. The output of an image sensor to which a Bayer filter is applied can be reconstructed as a color image using interpolation techniques.

Image sensors are subject to various performance constraints including, among others, dynamic range, signal to noise (SNR) ratio and low light sensitivity. The dynamic range is defined as the ratio of the maximum possible signal that can be captured by a pixel to the total noise signal. The SNR of a captured image is, to a great extent, a measure of image quality. In general, as more light is captured by the pixel, the higher the SNR. The light sensitivity of an image sensor is typically determined by the intensity of light incident upon the sensor pixels. At low light levels, each pixel's light gathering capability is constrained by the low signal levels incident upon each pixel.

A challenge associated with increasing the number of pixels in an image sensor is that the lens system is dimensioned to span the image sensor. The problem is most acute with mobile cameras, such as those used in mobile phones and consumer electronics devices, where the form factor of the lens system can significantly impact the overall form factor of the mobile device.

In response to the constraints placed upon a traditional digital camera based upon the camera obscura, a new class of cameras that can be referred to as array cameras have been proposed. Array cameras are characterized in that they include multiple arrays of pixels, each having a separate lens system. Examples of 2, 3 and 4 array cameras in which each array of pixels captures light from a different band of the visible spectrum and the captured images are combined to create a full color image are disclosed in U.S. Pat. No. 7,199,348 to Olsen et al., the disclosure of which is incorporated by reference herein in its entirety. U.S. Pat. No. 7,262,799 to Suda, the disclosure of which is incorporated herein by reference in its entirety, discloses a 2×2 array camera including one sensor used to sense a red (R) image signal, one sensor used to sense a blue (B) image signal and, two sensors used to sense green (G) image signals.

SUMMARY OF THE INVENTION

Imager arrays, array camera modules, and array cameras in accordance with embodiments of the invention are configured to introduce a predetermined amount of aliasing into captured images of a scene that can then be used to construct a super-resolution image by super-resolution processing system. One embodiment of the invention includes a plurality of focal planes, where each focal plane includes a two dimensional arrangement of pixels having at least two pixels in each dimension and each focal plane is contained within a region of the imager array that does not contain pixels from another focal plane, control circuitry configured to control the capture of image information by the pixels within the focal planes, and sampling circuitry configured to convert pixel outputs into digital pixel data. In addition, the pixels in the plurality of focal planes include a pixel stack including a microlens and an active area, where light incident on the surface of the microlens is focused onto the active area by the microlens and the active area samples the incident light to capture image information, and the pixel stack defines a pixel area and includes a pixel aperture, where the size of the pixel aperture is smaller than the pixel area.

In some embodiments in accordance with this invention, a pixel aperture is formed by a microlens that is smaller than the pixel area to introduce a certain amount of aliasing into the information captured by the pixel. In further embodiments, the pixel area may be increased to be substantially equal to or greater that the focal point of the microlens in a pixel stack to introduce a certain amount of aliasing into the captured information. In still further embodiments, the pixel pitch or distance between pixels is adjusted to introduce a certain amount of aliasing into the information captured by the pixels. In still yet further embodiments, two or more of the previously described techniques are used to introduce a certain amount of aliasing into the captured information.

BRIEF DESCRIPTION OF THE DRAWINGS

FIG. 9A is an image generated by performing super-resolution processing on images of a scene captured using an imager array having gapless microlenses.

FIG. 9B is an image generated by performing super-resolution processing on images of a scene in which aliasing has been increased in accordance with embodiments of the invention.

DETAILED DESCRIPTION

Figure 1:
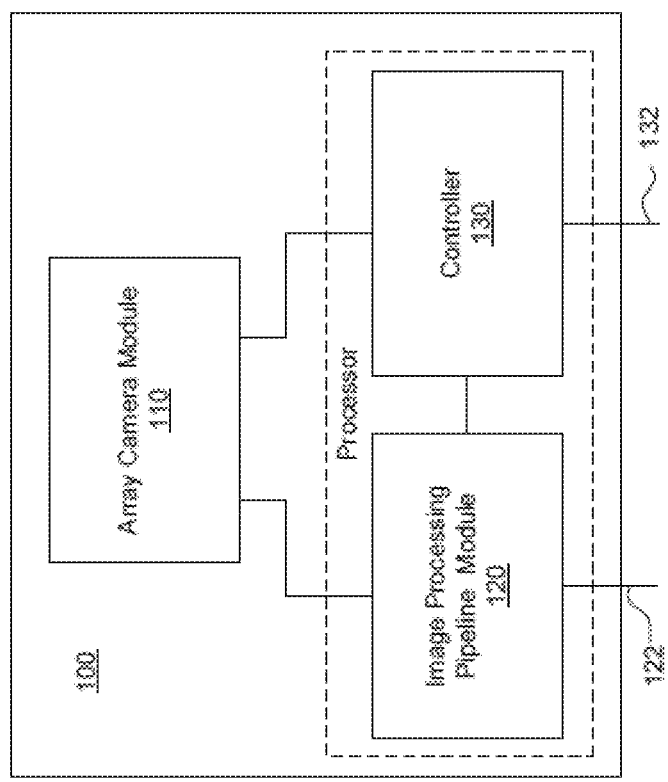
FIG. 1 is a block diagram of an array camera in accordance with an embodiment of the invention.

Turning now to the drawings, systems and methods for controlling the amount of aliasing in images captured by an array camera and for synthesizing higher resolution images from the captured images using super-resolution processing in accordance with embodiments of the invention are illustrated. Images exhibit aliasing when they are sampled at too low a sampling frequency, resulting in visible steps on diagonal lines or edges (also referred to as "jaggies") and artificial low frequency patterns (often referred to as Moiré). These artifacts are a product of the incorrect sampling of higher frequencies, which results in the higher frequencies folding back (being aliased) into lower frequencies. Aliasing is generally undesirable, however, array cameras in accordance with embodiments of the invention can utilize the high frequency information folded into the lower frequencies during super-resolution processing. In a super-resolution process, low resolution images that include sampling diversity (i.e. represent sub-pixel offset shifted views of a scene) are used to synthesize one or more higher resolution images. Each low resolution image samples a slightly different part of the scene and the super-resolution process utilizes the sampling diversity to synthesize a higher resolution image by fusing the multiple low-resolution images together on a higher resolution grid. Various super-resolution processes are discussed in detail in U.S. patent application Ser. No. 12/967,807, entitled "Systems and Methods for Synthesizing High Resolution Images Using Super-Resolution Processes", to Lelescu et al., the disclosure of which is incorporated by reference herein in its entirety. Due to the fact that each low resolution image includes a sub-pixel shifted view of the scene, aliasing present in each of the low resolution images is slightly different. Therefore, the aliasing in each of the images provides useful information about high frequency image content that can be exploited by the super-resolution process to increase the overall resolution of the synthesized image.

In a number of embodiments, increasing the amount of aliasing in the low resolution images captured by an array camera can increase the resolution achieved through super-resolution processing. The amount of aliasing in captured images of a band limited spectrum of light (e.g. visible light) incident on the pixels can be controlled in any of a variety of ways including (but not limited to) using pixel apertures, modifying pixel pitch, modifying the size of the pixel area and/or increasing the optical resolution of the optical channels used to form images on the pixels of a focal plane so that the pixels sample the received light at a frequency that is less than twice the highest frequency of light within the band limited spectrum.

Increasing aliasing in captured low resolution images can complicate parallax detection and correction when performing super-resolution processing. Aliasing is a result of insufficient spatial sampling frequency in each camera, and can manifest itself differently in the images captured by the different cameras. In a number of embodiments, pixel correspondence in the presence of aliasing is determined using an approach that can be referred to as "hypothesized fusion". Since aliasing effects are varied in the different images, at incorrect depths, a fused image is likely to be considerably different from the scene. At the correct depth, high resolution information obtained from the aliasing in the low resolution images increases the similarity between the synthesized high resolution image and the scene. Accordingly, hypothesized fusion processes in accordance with embodiments of the invention fuse high resolution images or portions of high resolution images using a set of low resolution images at a number of different hypothesized depths. The highest similarity between a fused high resolution image or high resolution image portion and a scene captured in a set of low resolution images is likely to be observed when correct depth hypotheses are utilized. The similarity between a fused high resolution image and a scene captured in a set of low resolution images can be determined in any of a variety of different ways. In several embodiments, similarity is determined by using a forward mapping to compare forward mappings of the fused high resolution image at a hypothesized depth to the captured low resolution images. In many embodiments, the similarity of pixels in pixel stacks of a portion of a fused high resolution image are used to indicate the likely similarity of the portion of the fused high resolution image to the scene captured by the low resolution images. In a number of embodiments, multiple fused high resolution images or high resolution image portions are generated using different subsets of the captured low resolution images at different hypothesized depths and the multiple fused high resolution images or high resolution image portions are compared to determine the hypothesized depth at which the fused high resolution images or high resolution image portions are best matched. In several embodiments, the sets of focal planes used to fuse the high resolution images utilized during hypothesized fusion include focal planes that are common to two or more of the sets. In a number of embodiments, the viewpoint of one of the focal planes is used as the reference viewpoint for synthesizing a high resolution image and the reference focal plane is common to the sets of focal planes used during hypothesized fusion. In other embodiments, disjoint sets of focal planes are utilized.

By analyzing the similarity of a fused high resolution image or image portion to the scene captured in a set of low resolution images at different hypothesized depths, depth information can be obtained that can be used to perform parallax correction and complete the super-resolution processing of the low resolution images. Although much of the discussion that follows refers to determining depths based upon portions of fused high resolution images, it should be appreciated that analysis using fused high resolution images is computationally efficient and that additional processing can be utilized to refine the fused high resolution images during analysis up to an including synthesizing high resolution images. Accordingly, references to fused high resolution images in the discussion of hypothesized fusion should be understood as encompassing images obtained by simply performing raw fusion, which places captured image samples onto a higher resolution grid (possibly resulting in overlaps and missing sample positions), and encompassing images obtained by performing additional processing beyond the raw fusion. The distinctions between obtaining an high resolution image through raw fusion and synthesizing an high resolution image using super-resolution processing are explored more completely in U.S. patent application Ser. No. 12/967,807 incorporated by reference above.

Array cameras that control the amount of aliasing present in captured low resolution images using a variety of techniques including (but not limited) controlling the pixel pitch of the focal planes of the array camera, and/or adjusting the size of the active area of pixel and/or using pixel apertures to control attenuation of aliasing due to blur; and super-resolution processes that utilize hypothesized fusion to determine pixel correspondence in the presence of aliasing in accordance with embodiments of the invention are discussed further below.

Array Camera Architecture

An array camera architecture that can be used in a variety of array camera configurations in accordance with embodiments of the invention is illustrated in FIG. 1. The array camera 100 includes an array camera module 110, which is connected to an image processing pipeline module 120 and to a controller 130. In many embodiments, the image processing pipeline module 120 and controller 130 are implemented using software applications and/or firmware executing on a microprocessor. In other embodiments, the modules can be implemented using application specific circuitry.

The array camera module 110 includes two or more cameras, each of which receives light using a separate optical channel. The array camera module can also include other circuitry to control imaging parameters and sensors to sense physical parameters. The control circuitry can control imaging parameters such as exposure times, gain, and black level offset. In several embodiments, the circuitry for controlling imaging parameters may trigger each camera independently or in a synchronized manner. The array camera module can include a variety of other sensors, including but not limited to, dark pixels to estimate dark current at the operating temperature. Array camera modules that can be utilized in array cameras in accordance with embodiments of the invention are disclosed in U.S. patent application Ser. No. 12/935,504 entitled "Capturing and Processing of Images using Monolithic Camera Array with Heterogeneous Imagers" to Venkataraman et al., the disclosure of which is incorporated herein by reference in its entirety.

The image processing pipeline module 120 is hardware, firmware, software, or a combination for processing the images received from the array camera module 110. In many embodiments, the image processing pipeline module 120 is implemented using an image processing pipeline application that is stored in memory and used to configure a microprocessor. The image processing pipeline module 120 processes the multiple low resolution images captured by the array camera module and produces a synthesized high resolution image. In a number of embodiments, the image processing pipeline module 120 provides the synthesized image data via an output 122.

The controller 130 is hardware, software, firmware, or a combination thereof for controlling various operational parameters of the imager array 110. In a number of embodiments, the controller 130 is implemented using a controller application stored in memory and used to configure a microprocessor. The controller 130 receives inputs 132 from a user or other external components and sends operation signals to control the array camera module 110. The controller 130 can also send information to the image processing pipeline module 120 to assist processing of the low resolution images captured by the array camera module 110.

Although a specific array camera architecture is illustrated in FIG. 1, alternative architectures that enable the capturing of low resolution images and application of super-resolution processes to produce one or more synthesized high resolution images can also be utilized in accordance with embodiments of the invention. Array camera modules and techniques for controlling the level of aliasing in the low resolution images captured by array cameras in accordance with embodiments of the invention are discussed below.

Array Camera Modules

Figure 2:
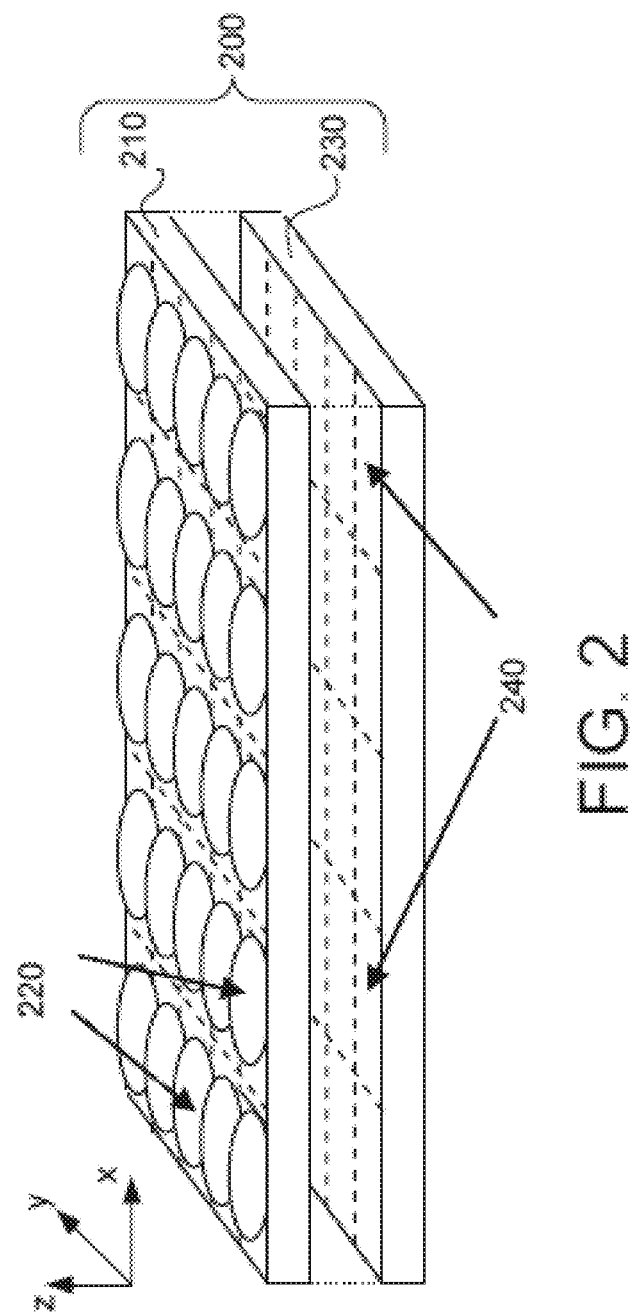
FIG. 2 is a conceptual illustration of an array camera module formed from an optic array of lens stacks and an imager array in accordance with an embodiment of the invention.

U.S. patent application Ser. No. 12/935,504 (incorporated by reference above) discloses a variety of array camera modules that can be utilized in array cameras. An exploded view of an array camera module formed by combining an optic array of lens stacks with a monolithic sensor that includes a corresponding array of focal planes is illustrated in FIG. 2. The array camera module 200 includes an optic array of lens stacks 210 and a sensor or imager array 230 that includes an array of focal planes 240. The optic array of lens stacks 210 includes an array of lens stacks 220. Each lens stack creates a separate optical channel that resolves an image on a corresponding focal plane 240 on the sensor. The lens stacks may be of different types. For example, the optical channels may be used to capture images at different portions of the spectrum and the lens stack in each optical channel may be specifically optimized for the portion of the spectrum imaged by the focal plane associated with the optical channel. More specifically, an array camera module may be patterned with "π filter groups." The term "π filter groups" refers to a pattern of color filters applied to the optic array of lens stacks of a camera module and processes for patterning array cameras with π filter groups are described in U.S. Patent Application Ser. No. 61/641,164, entitled "Camera Modules Patterned with π Filter Groups", Venkataraman et al. The disclosure of U.S. Patent Application Ser. No. 61/641,164 is incorporated by reference herein in its entirety. Filter patterns that can be utilized in array camera modules are disclosed further in U.S. patent application Ser. No. 12/935,504 and U.S. Provisional Patent Application Ser. No. 61/641,165.

In accordance with embodiments of this invention, each lens stack 220 is configured not to be optically limited because the super-resolution imaging process is able to recover a higher resolution in the output image than the intrinsic resolution of the low resolution images captured by the focal planes of the imager array. Therefore, each lens stack 220 optically resolves with sufficient contrast spatial frequencies that are larger than the Nyquist frequency as defined by the pixel pitch of the underlying focal plane 240.

Each lens stack 220 is specified in terms of the Modulation Transfer Function (MTF) curve over a range of spatial frequencies. The MTF is a Spatial Frequency Response (SFR) of the output signal contrast with the input spatial frequency. At low frequencies, the imaging system or focal plane 240 typically passes the signal unattenuated, which implies a contrast of 100%. At higher frequencies, the signal is attenuated and the degree of attenuation in the output signal from the focal plane 240 is expressed as a percentage with respect to the input signal. In an array camera it is desirable to receive content above the Nyquist frequency to allow the super-resolution process to recover higher resolution information. When multiple copies of an aliased signal are present, such as in multiple images from the focal planes 240 the information inherently present in the aliasing may be used to reconstruct the higher resolution signal. One skilled in the art will note that the aliasing patterns from the different focal planes 240 have slight differences due to the sampling diversity of the focal planes. These slight differences result from the slightly different viewing directions of the cameras used to capture the low resolution images that are either intentionally introduced or result from positional manufacturing tolerances of the individual focal planes. Thus, in accordance with some embodiments of this invention, the MTFs of the lens stacks 220 need to be at least as high as the desired high resolution output MTF to provide sufficient contrast.

An optic array of lens stacks may employ wafer level optics (WLO) technology. WLO is a technology that encompasses a number of processes, including, for example, molding of lens arrays on glass wafers, stacking of those wafers (including wafers having lenses replicated on either side of the substrate) with appropriate spacers, followed by packaging of the optics directly with the imager into a monolithic integrated module.

The WLO procedure may involve, among other procedures, using a diamond-turned mold to create each plastic lens element on a glass substrate. More specifically, the process chain in WLO generally includes producing a diamond turned lens master (both on an individual and array level), then producing a negative mould for replication of that master (also called a stamp or tool), and then finally forming a polymer replica on a glass substrate, which has been structured with appropriate supporting optical elements, such as, for example, apertures (transparent openings in light blocking material layers), and filters. Although the construction of optic arrays of lens stacks using specific WLO processes is discussed above, any of a variety of techniques can be used to construct optic arrays of lens stacks, for instance those involving precision glass molding, polymer injection molding or wafer level polymer monolithic lens processes. Any of a variety of well known techniques for designing lens stacks used in conventional cameras can be utilized to increase aliasing in captured images by improving optical resolution. Accordingly, the level of aliasing present in images captured by an array camera module in accordance with embodiments of the invention can be determined through selection of aspects of lens stacks including (but not limited to) adding lens surfaces, changing the F# of the lens stack, and selection of materials used in construction of lens stack. Imager arrays that can capture images formed by optic arrays of lens stacks in accordance with embodiments of the invention are discussed further below.

Imager Arrays

Figure 3:
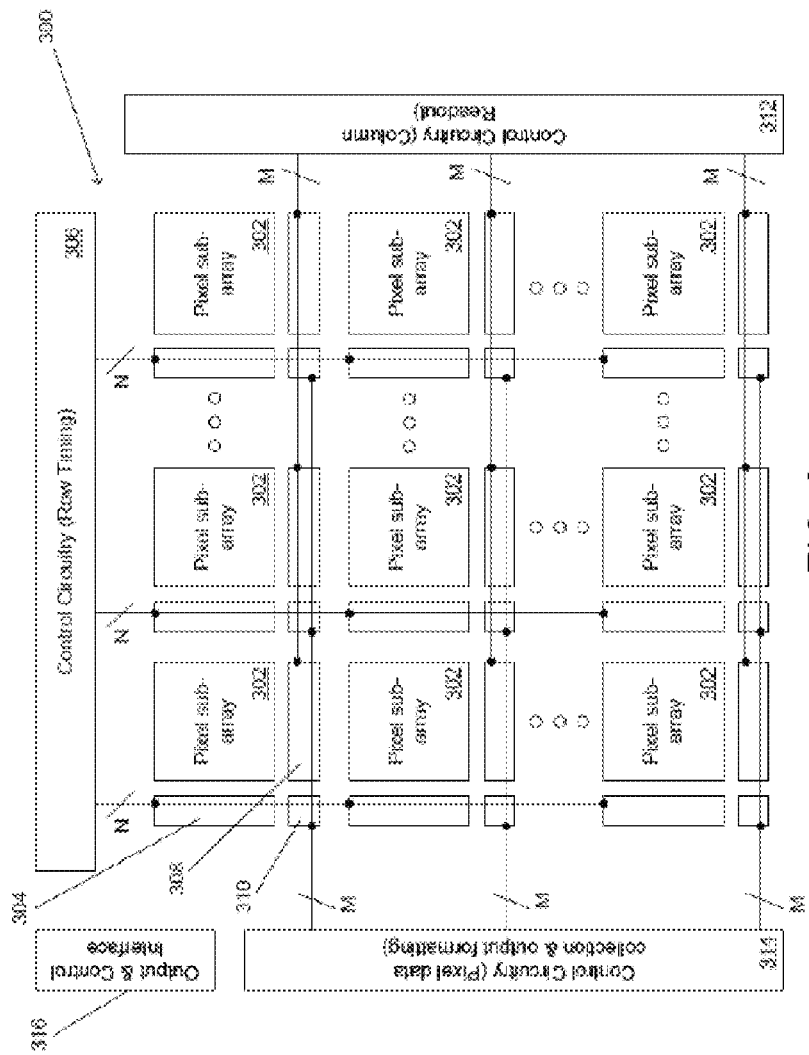
FIG. 3 is a conceptual illustration of focal planes on an imager array in accordance with an embodiment of the invention.

Imager arrays can be implemented using any of a variety of configurations in which an array of focal planes is formed on one or more sensors. A variety of imager array architectures are disclosed in U.S. patent application Ser. No. 13/106,797, entitled "Architectures for Imager Arrays and Array Cameras" to Pain et al., the disclosure of which is incorporated by reference herein in its entirety. An imager array including multiple focal planes having independent read-out control and pixel digitization, where each focal plane has dedicated peripheral circuitry, in accordance with embodiments of the invention is illustrated in FIG. 3. The imager array 300 includes a plurality of sub-arrays of pixels or focal planes 302, where each focal plane includes a two dimensional arrangement of pixels having at least two pixels in each dimension and each focal plane is contained within a region of the imager array that does not contain pixels from another focal plane. The focal planes have dedicated row control logic circuitry 304, which is controlled by a common row timing control logic circuitry 306. Although the column circuits and row decoder are shown as a single block on one side of the focal plane, the depiction as a single block is purely conceptual and each logic block can be split between the left/right and/or top/bottom of the focal plane so as to enable layout at double the pixel pitch. Laying out the control and read-out circuitry in this manner can result in a configuration where even columns are sampled in one bank of column (row) circuits and odd columns would be sampled in the other.

In a device including M×N focal planes, the read-out control logic includes M sets of column control outputs per row of focal planes (N). Each column sampling/read-out circuit 308 can also have dedicated sampling circuitry for converting the captured image information into digital pixel data. In many embodiments, the sampling circuitry includes an Analog Signal Processor (ASP), which includes an Analog Front End (AFE) amplifier circuit and an Analog to Digital Converter (ADC) 310. In other embodiments, any of a variety of analog circuitry can be utilized to convert captured image information into digitized pixel information. An ASP can be implemented in a number of ways, including but not limited to, as a single ASP operating at X pixel conversion per row period, where X is the number of pixels in a row of the focal plane served by the column sampling circuit (e.g. with a pipe-lined or SAR ADC), as X ASPs operating in parallel at 1 pixel conversion per row period or P ASPs operating in parallel at X/P conversions per row (see discussion below). A common read-out control circuit 312 controls the read-out of the columns in each imager.

In the illustrated embodiment, the master control logic circuitry 314 controls independent read-out of each imager. The master control logic circuitry 314 includes high-level timing control logic circuitry to control the image capture and read-out process of the individual focal plane. In a number of embodiments, the master control portion of this block can implement features including but not limited to: staggering the start points of image read-out such that each focal plane has a controlled temporal offset with respect to a global reference; controlling integration times of the pixels within specific focal planes to provide integration times specific to the spectral bandwidths being imaged; the horizontal and vertical read-out direction of each imager; the horizontal and vertical sub-sampling/binning/windowing of the pixels within each focal plane; the frame/row/pixel rate of each focal plane; and the power-down state control of each focal plane.

The master control logic circuitry 314 can also handle collection of pixel data from each of the imagers. In a number of embodiments, the master control logic circuitry packs the image data into a structured output format. Given that fewer than M×N output ports are typically used to output the image data (e.g. there are 2 output ports), the image data is time multiplexed onto these output ports. In a number of embodiments, a small amount of memory (FIFO) is used to buffer the data from the pixels of the imagers until the next available time-slot on the output port 316 and the master control logic circuitry 314 or other circuitry in the imager array periodically inserts codes into the data stream providing information including, but not limited to, information identifying a focal plane, information identifying a row and/or column within a focal plane, and/or information identifying the relative time at which the capture or read-out process began/ended for one or more of the focal planes. Relative time information can be derived from an on-chip timer or counter, whose instantaneous value can be captured at the start/end of read-out of the pixels from each imager either at a frame rate or a line rate. Additional codes can also be added to the data output so as to indicate operating parameters such as (but not limited to) the integration time of each focal plane, and channel gain. As is discussed further below, the host controller can fully re-assemble the data stream back into the individual images captured by each focal plane. In several embodiments, the imager array includes sufficient storage to buffer at least a complete row of image data from all focal planes so as to support reordering and or retiming of the image data from all focal planes such that the data is always packaged with the same timing/ordering arrangement regardless of operating parameters such as (but not limited to) integration time and relative read-out positions. In a number of embodiments, the imager array includes sufficient storage to buffer at least a complete line of image data from all focal planes so as to support reordering and or retiming of the image data from all focal planes such that the data is packaged in a convenient manner to ease the host's reconstruction of the image data, for example retiming/reordering the image data to align the data from all focal planes to a uniform row start position for all focal planes irrespective of relative read-out position.

Although specific imager array implementations are discussed above with reference to FIG. 3, any of a variety of imager arrays can be utilized in an array camera including (but not limited to) the imager arrays disclosed in U.S. patent application Ser. No. 13/106,797 as appropriate to the requirements of a specific application in accordance with an embodiment of the invention. The introduction of aliasing into images captured by an array camera and the recovery of high resolution information using the aliasing via super-resolution processing in accordance with embodiments of the invention are discussed further below.

Introducing Aliasing into Images Captured by an Array Camera

From sampling theory it is known that the Nyquist frequency of an image sensor is simply one half the reciprocal of the pixel pitch. Frequencies above the Nyquist frequency cannot be sampled correctly by the image sensor and result in aliasing. Sampling theorem indicates that a judicious choice of pixel pitch (i.e. sampling rate) when sampling a bandlimited function can completely avoid aliasing, but it cannot avoid aliasing when sampling inherently non-bandlimited functions. Therefore, increasing the pixel pitch of an imager can increase the aliasing in images captured by the imager. As is discussed further below, aliasing present in a captured image can also be increased without increasing pixel pitch.

Instead of attempting to reduce aliasing, many systems in accordance with embodiments of the invention actively introduce aliasing through the design of the optics and pixel stacks in each of the cameras in the array camera. The aliasing introduced by design can be utilized in super-resolution processing to recover information with a spatial frequency approaching the spatial frequency of the images formed on the focal planes of the cameras by the optics, which is greater than the Nyquist frequency of the focal plane. The extent to which aliasing is present in images captured by pixels in a focal plane depends on a number of factors including the pixel pitch. In several embodiments, array camera modules are constructed so that the MTF characteristics of the optics are such that images formed on a focal plane include contrast at a spatial frequency that is slightly greater than the resolution of high resolution images synthesized by the array camera and significantly greater than the Nyquist frequency of the pixels in the focal plane. In several embodiments, the pixels in the focal plane include pixel apertures that reduce pixel blur thereby increasing the extent to which aliasing is present in the captured image. In several embodiments, pixel apertures are created using microlenses. In many embodiments, pixel apertures are created using light blocking materials. The extent of pixel blur can also be reduced by reducing the size of the active area of a pixel relative to the size of the pixel pitch. Various techniques for increasing aliasing present in images captured by focal planes of array cameras in accordance with embodiments of the invention are discussed further below.

Using Pixel Pitch to Control Aliasing

In accordance with a number of embodiments of this invention, the pixel pitch or distance between pixels may be used to control aliasing. It is understood that the Nyquist frequency is equal to one-half the inverse of the pixel pitch. Sampling theorem indicates that a judicious choice of pixel pitch (i.e. sampling rate) when sampling a bandlimited signal can completely avoid aliasing. Filters are typically used within the optical channel of a camera to create a bandlimited signal having an MTF cutoff near the Nyquist frequency of the sensor. As discussed above, optical channels in accordance with embodiments of the invention are bandlimited, but at a frequency that is higher than the Nyquist frequency of the sensor so that images formed on the focal plane can resolve contrast at a spatial frequency corresponding to the highest frequency component of images synthesized by the array camera through super-resolution processing. However, aliasing relative to the bandlimited signal is desirable to facilitate information at a spatial resolution that is greater than the pixel pitch of the pixels on a focal plane. Therefore, increasing the pixel pitch of a focal plane can increase the aliasing in images captured by the focal plane. A pixel array of a focal plane having a pixel pitch selected to introduce aliasing into the images captured in accordance with embodiments of this invention is shown in FIG. 4D.

Figure 4A:
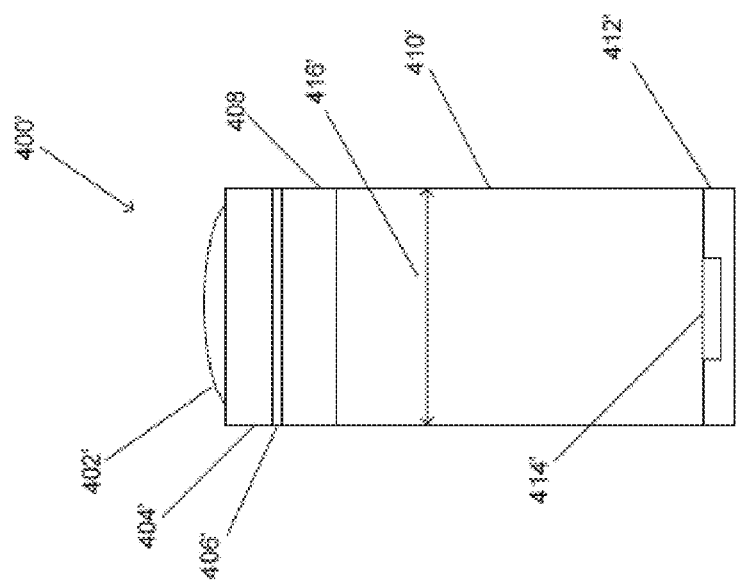
FIG. 4A is a cross-sectional view of a conventional gapless microlens pixel stack that is typical of the pixel stacks used in many conventional cameras.
Figure 4B:
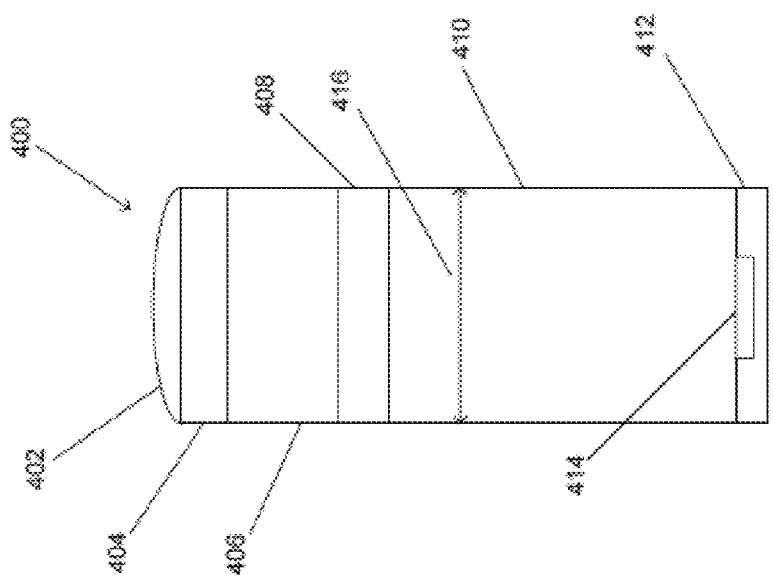
FIG. 4B is a cross-sectional view of a pixel stack including a pincushion microlens that can increase the aliasing present in a captured image relative to the gapless microlens illustrated in FIG. 4A.
Figure 4C:
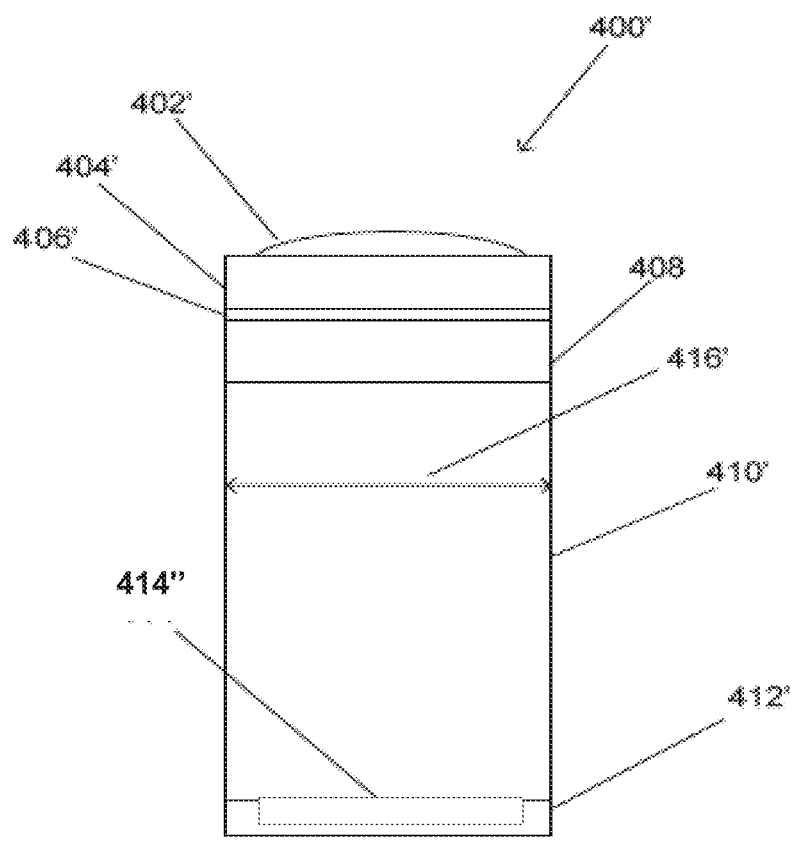
FIG. 4C is a cross-sectional view of a pixel stack having a sensor area that is larger than a focal point of the microlens on the top of the pixel stack.
Figure 4D:
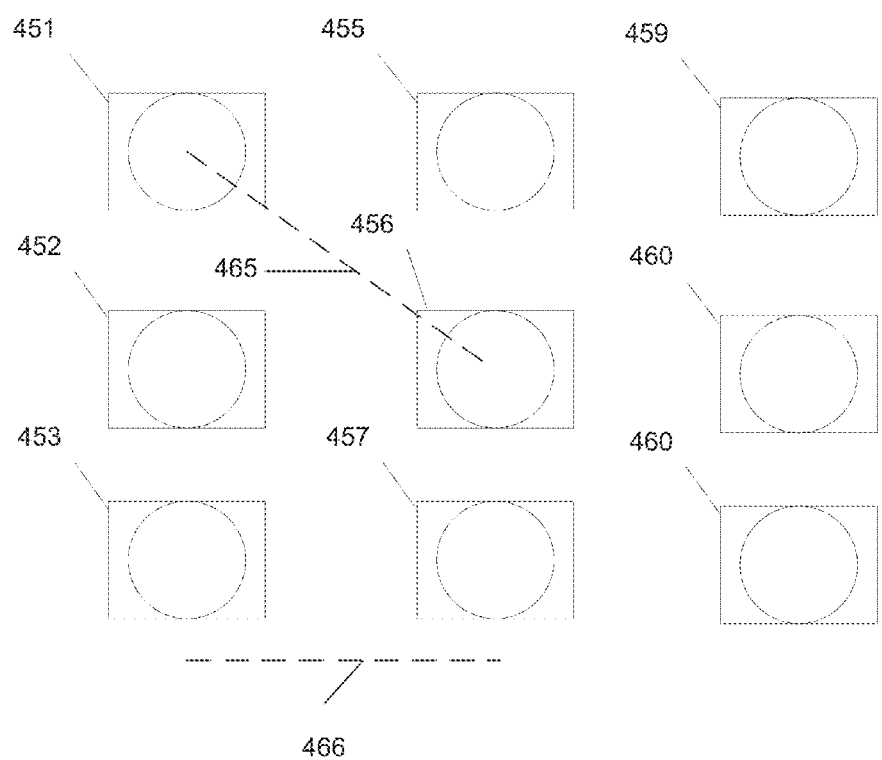
FIG. 4D is a top-side view of an array of pixels in an imager of an array camera having a pixel pitch that is

In FIG. 4D, a pixel array 450 includes pixel sensors 451-460. Adjacent pixels, such as 452,453; 453,457; and 451, 456 are spaced a certain distance apart from one another as indicated by lines 465-467. Lines 465-467 represent the pixel pitch between these pairs. As such, lines 465-467 are substantially equal to one another in accordance with these embodiments. However, some distance may be irregular in other embodiments without departing from this invention. The distance of the pixel pitch between adjacent pixels is determined to introduce a desired amount of aliasing. The pixel pitch is determined based on a desired amount of aliasing appropriate to the requirements of a specific application in accordance with embodiments of the invention. The pixel pitch is directly related to the super-resolution factor r between the images captured by the pixels in the focal plane and the spatial resolution of images synthesized using super-resolution processes by the array camera.

While the amount of aliasing that can be present in images captured by pixels in a focal plane is determined by the pixel pitch, the actual amount of aliasing present in the captured images is a function of the blur introduced within the optical channel. Blur tends to act as a smoothing filter that can smooth out the effects of aliasing. Techniques for reducing blur to increase the amount of high frequency information present within aliasing in capture images in accordance with embodiments of the invention are discussed below.

Using Microlenses to Decrease Blur and Increase Aliasing

In several embodiments, the aliasing present in images captured by an imager array is increased using microlenses that act as pixel apertures to reduce pixel blur. The manner in which microlenses can be used to increase the amount of aliasing in captured images can be appreciated with reference to FIGS. 4A and 4B. A conventional gapless microlens pixel stack that is typical of the pixel stacks used in many conventional cameras is illustrated in FIG. 4A. Although a single pixel stack is shown in FIG. 4A, one of ordinary skill in the art will appreciate that the pixels that form a focal plane each have pixel stacks, which are similar. The pixel stack 400 includes a microlens 402, which is typically 0.3 µm at its thickest region (although this thickness can vary from company to company and process to process). The microlens sits atop an oxide layer 404, which is typically 0.3 µm thick. Beneath the oxide layer 404 is a color filter 406, which is typically 1.0 µm thick. The color filter 406 is above a nitride layer 408, which is typically 0.3 µm thick. The nitride layer 408 is above a second oxide layer 210, which is 1.0 µm thick, and sits atop the silicon 412 that includes the active area 414 of the sensor (typically a photodiode). Although specific dimensions are referenced above, the dimensions of a pixel stack are largely determined by the manufacturing processes utilized and the requirements of a specific application.

The main task of a microlens 402 is to gather the light incident on its surface and focus that light onto the small active area 414. The top oxide layer 404 separates the microlens layer from the color filter layer 406 and provides a suitable surface for effective microlens formation. The nitride passivation layer 408 and bottom oxide layer 410 provide support and isolation for the metal interconnects that are used to connect the various parts of the sensor. The active area 414 represents a small part of the pixel stack and is responsible for sampling the light incident on it. The pixel aperture (416) is determined by the spread of the microlens, which collects the light and focuses it on the active area 414. Due to the fact that the microlens spans the pixel area, the microlens 402 can be referred to as a gapless microlens.

The blur of the light field incident on a microlens array can be reduced by reducing the spread of the microlenses used in the pixel stacks of the focal plane. Thus, altering the microlenses in this fashion can be used to control the degree of aliasing present in captured images.

A microlens that results in increased aliasing in a captured image relative to the image that would be captured using the gapless microlens 402 illustrated in FIG. 4A is illustrated in FIG. 4B. The pixel stack 400' includes a microlens 402', which is smaller than the pixel area (i.e. the edges of microlens do not extend to the edges of the pixel area). The microlens 402' increases the aliasing present in the captured image as compared to the gapless microlens 402 shown in FIG. 4A. The microlens thus effectively acts as a pixel aperture, controlling the amount of light that is incident on the photodiode. In many array cameras, the pixels in each focal plane are typically sensitive to only one color thus the color filters in the pixel stack can be reduced or removed entirely and placed in the optic array of lens stacks. In other embodiments, the pixels in at least one of the focal planes are patterned with a pattern of color filters corresponding to a Bayer pattern or a similar pattern appropriate to the requirements of a specific application. In the illustrated embodiment, the color filter is significantly thinner (e.g. less than 0.1 µm), which reduces the overall height of the pixel stack 200'. Although a specific pixel stack is illustrated in FIG. 4B, as will be appreciated from the description below other pixel stacks that incorporate pincushion microlenses, reduce or remove color filters, include light blocking materials to create pixel apertures that are smaller than the pixel pitch and/or have decreased pixel stack height can be utilized in imager arrays in accordance with embodiments of the invention.

An advantage of decreased pixel aperture can be increasing the amount of aliasing present in captured images and, therefore, the increase in resolution that can be recovered through super-resolution processing. Decreasing pixel apertures can come at the expense of decreased sensitivity. Although specific pixel stacks are described above, any of a variety of pixel stacks having pixel apertures that are smaller than the pitch of the pixels within a focal plane can be utilized as appropriate to the requirements of specific application in accordance with embodiments of the invention. As is discussed further below, decreasing the size of the pixel apertures within a focal plane can increase aliasing, which can be utilized during super-resolution processing to recover information concerning high frequency components of the image.

Factors Influencing Pixel Stack Design

Reducing the size of microlenses within the pixel stacks of the pixels in a focal plane can increase aliasing in images captured by the focal plane. However, reducing the size of the microlenses can also impact pixel sensitivity and crosstalk in the sensor. Any reduction in the size of the microlens relative to pixel pitch directly reduces the amount of light that is gathered (i.e. the sensitivity of the pixel). In many embodiments, each sensor in the focal plane is sensitive to only one color (e.g.: red, green, or blue). Therefore, the color filters on the pixel stack are all the same color. The absence of the ubiquitous Bayer filter implies that the pixels in a focal plane are not subject to inter-color crosstalk. This allows the use of color filters that are thinner than those in sensors with the Bayer filter, leading to correspondingly higher transmissivities. Therefore, the imagers in an array camera can have increased sensitivity compared to the sensors of a conventional camera outfitted with a Bayer color filter, which can offset the reduction in sensitivity associated with the pincushion microlens (i.e. a microlens that is smaller than the pixel pitch). In many embodiments, however, at least one focal plane in an imager array utilizes a Bayer color filter and the pixel stacks within the focal plane are configured accordingly.

When light entering the microlens/filter of one pixel stack is directed toward a neighboring pixel, the light that is passed from one pixel stack to another is referred to as crosstalk or more specifically as optical crosstalk. Finite difference time domain simulations have shown that the amount of crosstalk in a pixel stack is directly proportional to the height of the pixel stack. Removing or reducing the thickness of the color filter in the pixel stack reduces the overall height of the pixel stack and reduces optical crosstalk. In many embodiments rearranging the color filters from the pixel stack to the optic array of lens stacks can mitigate any increase in crosstalk associated with use of a microlens in the pixel stack.

When gaps are introduced between microlenses in a focal plane, the possibility exists that stray light can enter the pixel stack through the gaps and fall on the active area of the pixel stack, increasing the crosstalk and diminishing signal to noise ratio. In several embodiments, a light blocking material such as (but not limited to) a photoresist can be utilized to fill the gaps between the microlenses to reduce the likelihood that stray light will enter the pixel stack.

Although specific techniques are discussed above for increasing aliasing in the low resolution images through use of pixel apertures, other techniques including but not limited to techniques that utilize light blocking materials to create pixel apertures can also be utilized. Processes that can be used to recover higher resolution content from aliasing in low resolution images in accordance with embodiments of the invention are discussed below.

Modifying the Size of the Active Area of the Pixel Sensor to Decrease Aliasing Attenuation In accordance with some embodiments, the size of the active area 414" is decreased in pixel stack 400" to decrease blur and increase the amount of aliasing in captured images as shown in FIG. 4C. All other components of the pixel stack 400" in accordance with these embodiments are similar to the components of the pixel stack 400' described above with reference to FIG. 4B and a complete description of these components is omitted for brevity. In pixel stack 400", the size of the active area 414" is decreased as compared to the size of the active area 414' in FIGS. 4B and 414 in FIG. 4A. The decrease in size can also be considered to be a decrease in the ratio of the size of the active area of the pixel relative to the pixel pitch. The decrease in size of the active area 414" reduces blur and accordingly increases the amount of aliasing present in images captured by the focal plane to which the pixel belongs. In this way, the combination of pixel pitch and pixel size contribute to the extent of aliasing present in the captured images that can be recovered using super-resolution processing.

Combination of Techniques to Introduce Aliasing into Images

Based on the above descriptions of the various techniques for controlling the amount of aliasing present in captured images based upon the spatial frequency at which the camera optics resolve contrast, the Nyquist frequency of the focal plane (as determined by the pixel pitch), and the amount of blur introduced through the size of the pixel apertures and the active area of the pixels with reference to FIGS. 4B, 4C, and 4D, one skilled in the art will recognize that the amount of aliasing present in captured images is controlled using all of the above characteristics of a camera module. The extent of aliasing that is desirable is largely dependent upon the super-resolution factor, r, of the array camera (i.e. the ratio of the pixel pitch to resolution of the images synthesized by the array camera using super-resolution images). The amount of aliasing present in the captured images can be determined to achieve a desired amount of aliasing based upon the Nyquist frequency of the focal plane and the attenuation introduced by the pixel aperture and the active area of the pixel. Using the super-resolution factor and the attenuation introduced by the pixel stack, the pixel pitch that provides sufficient aliasing to achieve the desired super-resolution factor through super-resolution processing can be determined. Techniques for processing image data including aliasing captured by an array camera to synthesize images achieving a desired super-resolution factor in accordance with embodiments of the invention are discussed further below.

Image Processing

The processing of low resolution images to obtain an super-resolution image in accordance with embodiments of the invention typically occurs in an array camera's image processing pipeline. In many embodiments, the image processing pipeline performs processes that register the low resolution images prior to performing super-resolution processes on the low resolution images. In several embodiments, the image processing pipeline also performs processes that eliminate problem pixels and compensate for parallax.

Figure 5:
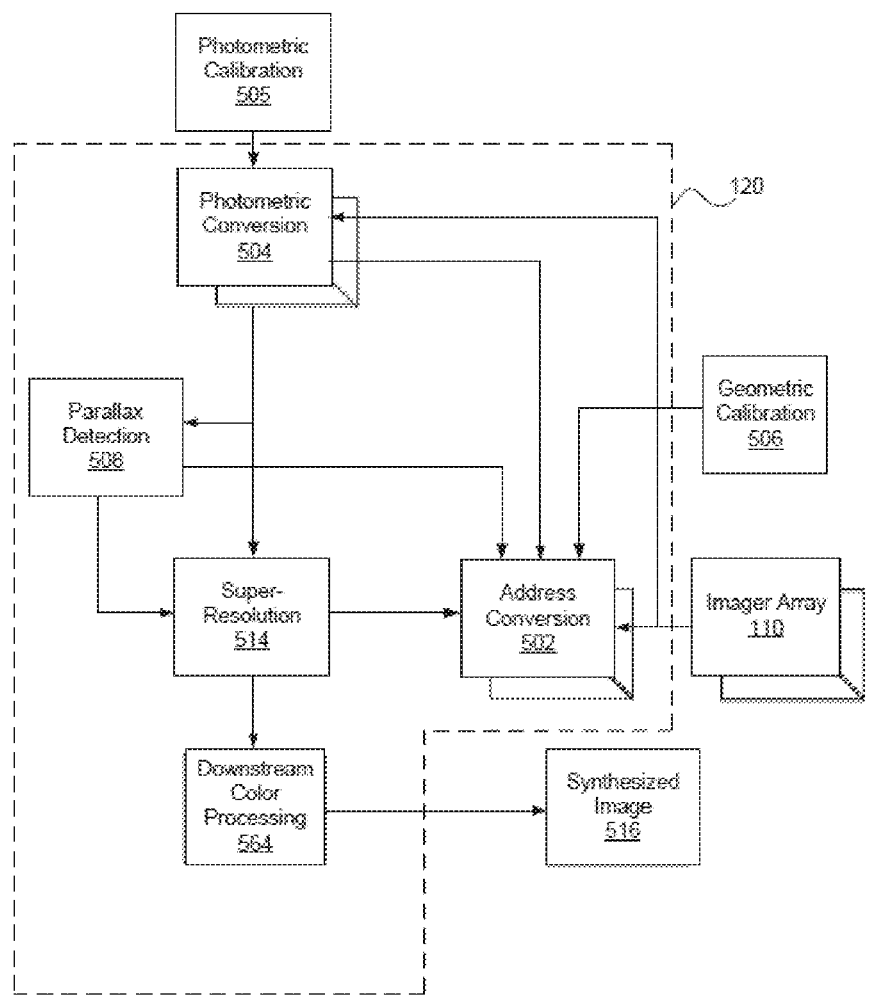
FIG. 5 illustrates an image processing pipeline in accordance with an embodiment of the invention.

An image processing pipeline incorporating a super-resolution module for fusing information from low resolution images to obtain one or more synthesized high resolution images in accordance with an embodiment of the invention is illustrated in FIG. 5. In the illustrated image processing pipeline 120, pixel information is read out from the focal planes in the imager array 110 and is provided to a photometric conversion module 504 for photometric normalization. The photometric conversion module can perform any of a variety of photometric image processing processes including but not limited to one or more of photometric normalization, Black Level calculation and adjustments, vignetting correction, and lateral color correction. In several embodiments, the photometric conversion module also performs temperature normalization. In the illustrated embodiment, the inputs of the photometric normalization module are photometric calibration data and the captured low resolution images. The photometric calibration data is typically captured during an offline calibration process. The output of the photometric conversion module 504 is a set of photometrically normalized low resolution images. These photometrically normalized images are provided to a parallax detection module 508 and to a super-resolution module 514.

Prior to performing super-resolution processing, the image processing pipeline detects parallax that becomes more apparent as objects in the scene captured by the imager array approach the imager array. In the illustrated embodiment, parallax (or disparity) detection is performed using the parallax detection module 508. In several embodiments, the parallax detection module 508 generates an occlusion map for the occlusion zones around foreground objects. In many embodiments, the occlusion maps are binary maps created for pairs of low resolution images. In many embodiments, occlusion maps are generated to illustrate whether a point in the scene is visible in the field of view of a reference imager and/or whether points in the scene visible within the field of view of the reference imager are visible in the field of view of other imagers. In order to determine parallax, the parallax detection module 508 performs scene independent geometric corrections to the photometrically normalized low resolution images using geometric calibration data 506 obtained via an address conversion module 502. The parallax detection module can then compare the geometrically and photometrically corrected low resolution images to detect the presence of scene dependent geometric displacements between low resolution images. Information concerning these scene dependent geometric displacements can be referred to as parallax information and can be provided to the super-resolution module 514 in the form of scene dependent parallax corrections and occlusion maps. Processes for performing parallax detection are discussed in U.S. Provisional Patent Application Ser. No. 61/691,666 entitled "Systems and Methods for Parallax Detection and Correction in Images Captured Using Array Cameras" to Venkataraman et al., the disclosure of which is incorporated by reference herein in its entirety. Designing a camera module to increase aliasing in captured low resolution images can complicate the process of determining the scene dependent parallax corrections. Processes that can be utilized to determine appropriate scene dependent parallax corrections in the presence of aliasing are discussed further below.

Geometric calibration (or scene-independent geometric correction) data 506 can be generated using an off line calibration process or a subsequent recalibration process. The scene-independent correction information, along with the scene-dependent geometric correction information (parallax) and occlusion maps, form the geometric correction information for the low resolution images. Once the parallax information has been generated, the parallax information and the photometrically normalized low resolution images can be provided to a super-resolution module 314 for use in the synthesis of one or more high resolution images 316.

In many embodiments, the super-resolution module 314 performs scene independent and scene dependent geometric corrections (i.e. geometric corrections) using the parallax information and geometric calibration data 306 obtained via the address conversion module 302. The photometrically normalized and geometrically registered low resolution images are then utilized in the synthesis of a high resolution image. The synthesized high resolution image 516 may then be fed to a downstream color processing module 564, which can be implemented using any standard color processing module configured to perform color correction and/or chroma level adjustment. In several embodiments, the color processing module performs operations including but not limited to one or more of white balance, color correction, gamma correction, and RGB to YUV correction.

In a number of embodiments, image processing pipelines in accordance with embodiments of the invention include a dynamic refocus module. The dynamic refocus module enables the user to specify a focal plane within a scene for use when synthesizing a high resolution image. In several embodiments, the dynamic refocus module builds an estimated high resolution depth map for the scene. The dynamic refocus module can use the high resolution depth map to blur the synthesized image to make portions of the scene that do not lie on the focal plane appear out of focus. In many embodiments, the super-resolution processing is limited to pixels lying on the focal plane and within a specified Z-range around the focal plane.

In several embodiments, the synthesized high resolution image 516 is encoded using any of a variety of standards based or proprietary encoding processes including but not limited to encoding the image in accordance with the JPEG standard developed by the Joint Photographic Experts Group. The encoded image can then be stored in accordance with a file format appropriate to the encoding technique used including but not limited to the JPEG Interchange Format (JIF), the JPEG File Interchange Format (JFIF), or the Exchangeable image file format (Exif).

Processing pipelines similar to the processing pipeline illustrated in FIG. 5 and the super-resolution processing performed by such image processing pipelines are described in U.S. patent application Ser. No. 12/967,807 (the disclosure of which is incorporated by reference above). Although specific image processing pipelines are described above, super-resolution processes in accordance with embodiments of the invention can be used within any of a variety of image processing pipelines that register low resolution images prior to super-resolution processing in accordance with embodiments of the invention. The manner in which aliasing within the low resolution images can be utilized by super-resolution processes to increase the overall resolution of the synthesized image in accordance with embodiments of the invention are discussed further below.

Super-Resolution Processing

In a super-resolution process, the images that are captured by the cameras that have fields of view that are at a sub-pixel offset relative to each other are used to synthesize a higher resolution image. When aliasing is introduced, the sub-pixel offsets in the fields of view of each of the cameras means that the aliasing is slightly different in each captured low resolution image. Therefore, the aliasing in each of the low resolution images provides useful information about high frequency image content that is exploited by the super-resolution process to increase the overall resolution of the synthesized high resolution image. However, increasing the aliasing in the low resolution images can complicate parallax detection and correction.

As is discussed in U.S. Provisional Patent Application Ser. No. 61/691,666, disparity between captured low resolution images can be determined by searching, in some robust manner, for similar pixels in pairs of images. However, such searches can be quickly confused in flat regions and in regions with repeating patterns or textures, as the pixel (or groups of pixels) under consideration in one camera can have multiple matches in another. Such spurious matches can be disambiguated to some extent by the use of scene information (prior) and/or pyramidal search techniques. However, such techniques typically fail in the presence of aliasing effects. Aliasing is a result of insufficient spatial sampling frequency in each camera, and can manifest itself differently in the images captured by the different cameras. As a result, pixel or patch matching (i.e. matching portions of images) using pyramidal techniques can also fail. Image processing pipelines and parallax detection processes in accordance with embodiments of the invention utilize the differences in high frequency information in each of the captured low resolution images, to establish pixel correspondence between the captured low resolution images in a way that accommodates the aliasing in each captured image. In a number of embodiments, pixel correspondence in the presence of aliasing is determined using an approach that can be referred to as "hypothesized fusion". Hypothesized fusion in accordance with embodiments of the invention is discussed further below.

Hypothesized Fusion

In many embodiments, hypothesized fusion processes are utilized to determine pixel correspondences in the presence of aliasing. Based upon the pixel correspondences, super-resolution processes (such as those described in U.S. patent application Ser. No. 12/967,807) can be performed that extract higher frequency content from the aliased frequencies in the images. However, in the absence of sub-pixel registration information, this can be non-trivial. As mentioned earlier, in the presence of aliasing, it is difficult to recover the depth of each pixel to obtain pixel correspondences among the various images. To circumvent this problem, multiple high resolution images or high resolution image patches can be obtained by fusing some or all of the captured low resolution images at various hypothesized depths. Only at the correct depth, will the fused high resolution image (or part of it) represent an image of the captured scene. Therefore, the depth of a point in a scene can be determined by fusing portions of low resolution images that contain the point in the scene at different hypothesized depths and selecting the depth of the point in the scene as the hypothesized depth at which the fused high resolution image most closely matches the scene. As is discussed further below, an array camera typically does not possess a baseline or ground truth concerning the scene. Therefore, the extent to which the fused high resolution image corresponds to the scene can be determined in any of a variety of ways. In several embodiments, the fused high resolution image is forward mapped using a process similar to that utilized using super-resolution processing and the resulting low resolution forward mapped images compared to the captured low resolution images. In many embodiments, the variance in pixel stacks in the fused high resolution image is used to indicate the similarity of the fused high resolution image to the scene. In a number of embodiments, multiple subsets of the captured low resolution images are fused to create multiple fused high resolution images or high resolution image portions and the multiple fused high resolution images or high resolution image portions are compared. In other embodiments, any of variety of techniques can be used to evaluate the similarity of one or more fused high resolution images or fused high resolution image portions to the scene captured in the low resolution images.

Figure 6:
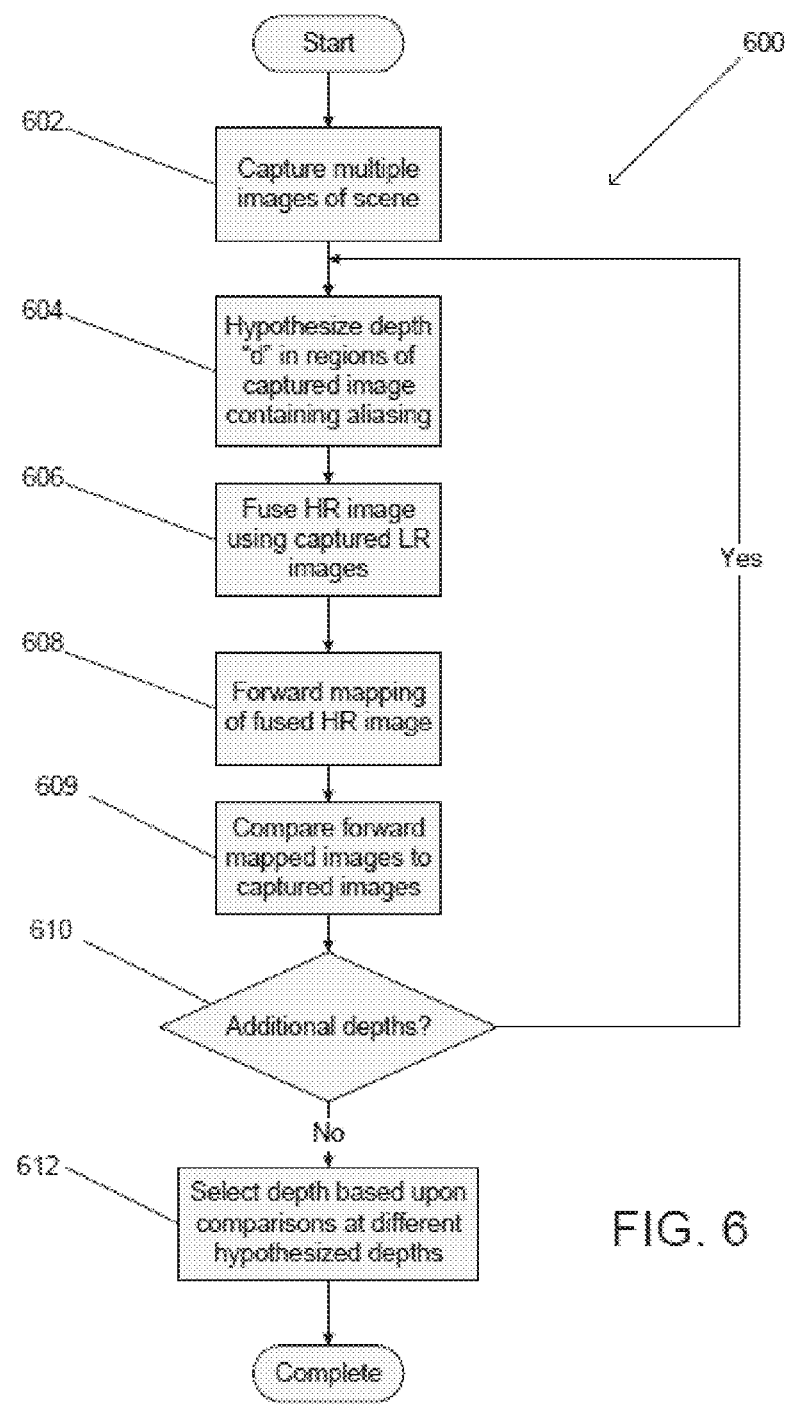
FIG. 6 is a flow chart illustrating a process for performing hypothesized fusion using forward mappings of high resolution images fused at different hypothesized depths in accordance with embodiments of the invention.

A process for performing hypothesized fusion in accordance with an embodiment of the invention is illustrated in FIG. 6. Initially, the process 600 involves capturing (602) multiple images of a scene. Due to the difficulty of ascertaining the parallax depth in aliased regions the process hypothesizes (604) a depth "d". Different embodiments may involve hypothesizing the depth 'd' in aliased regions using different measures and metrics. In one embodiment, the hypothesized depth may be an ordered list based on the 'n' closest pixels with high confidence depth maps. Given the depth "d", the pixel correspondence between registered captured images becomes fixed. The pixels from the corresponding images can then be mapped to a high resolution grid in an attempt to synthesize (606) an high resolution image. As is discussed in U.S. patent application Ser. No. 12/967,807, the resulting high resolution image is a representation of an image of the scene that is being captured. The process of capturing images using the focal planes in the imager array can be considered to involve transformation of the scene (which should correspond to the high resolution image of the scene) through a forward mapping process that can be modeled using appropriate transfer functions. The specific forward mapping (608) is dependent upon the construction of the array camera module. The low resolution image estimates produced by applying the forward mapping to the synthesized high resolution image can be compared (609) to the captured low resolution images and a matching score determined and saved. The process then determines (610) whether there are additional hypothesized depths to test. If there are, then a new hypothesized depth is used and the process repeats. When matching scores have been obtained at all of the hypothesized depths, the hypothesized depth that yields the best matching score can be selected as the final depth estimate. In many embodiments, additional termination conditions can be utilized when comparing the forward mapped low resolution images to the captured low resolution images. For example, if a good match of the aliased region is found, then the loop can terminate and the hypothesized depth "d" determined to be a good depth and the pixel correspondence between the captured images is confirmed.

An alternative to performing forward mapping of a fused or super-resolved high resolution image at different hypothesized depths to determine the extent to which the fused or super-resolved high resolution image corresponds with the scene captured by a set of low resolution images is to instead look at the characteristics of the pixels that are fused to create a portion of the high resolution image. In many embodiments, the number of captured low resolution images is sufficiently large so as to result in pixel stacks in the fused high resolution image. At the correct depth, the same or very similar pixels should be fused onto the same pixel locations in the higher resolution grid. Therefore, the similarity of the pixels in pixel stacks can be utilized as a measure of the similarity of a portion of a fused high resolution image to the scene captured in a set of low resolution images. In many embodiments, the extent to which a portion of a fused high resolution image at a specific hypothesized depth matches the scene captured in a set of low resolution images is determined based upon the variance of pixels within pixels stacks in the portion of the fused high resolution image.

Figure 6A:
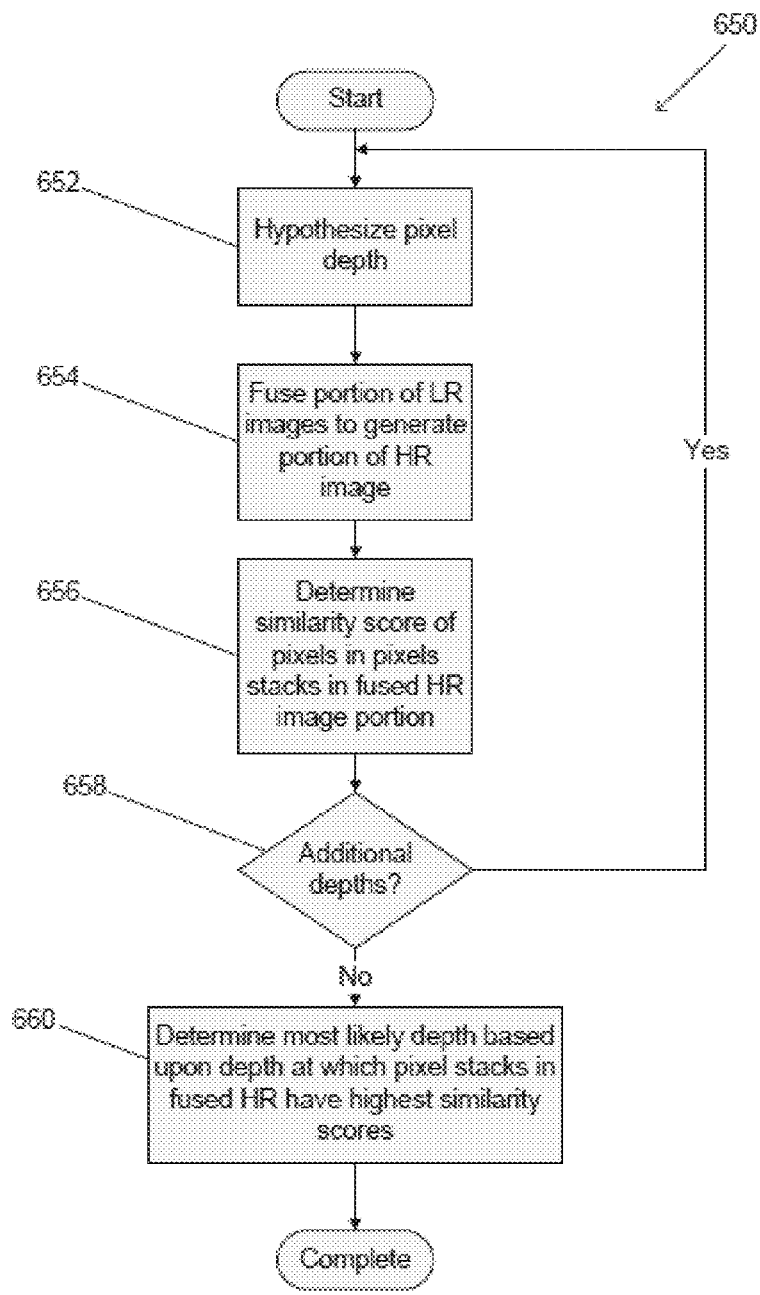
FIG. 6A is a flow chart illustrating a process for performing hypothesized fusion by looking at the similarity of pixel stacks in portions of fused higher resolution images at different hypothesized depths in accordance with embodiments of the invention.

A process for determining the depth of a point in a scene captured by a set of low resolution images by fusing portions of high resolution images at different hypothesized depths and selecting a depth based upon the variance in the pixel stacks of the fused high resolution image portions at each hypothesized depth in accordance with an embodiment of the invention is illustrated in FIG. 6A. The process 650 includes selecting (652) a hypothesized pixel depth, fusing (654) portions of low resolution images to generate a portion of an high resolution image at the selected hypothesized pixel depth, and determining (656) a matching score based on at least the variance of pixels within pixels stacks within the fused high resolution image portion. The process repeats until a determination (658) is made that a matching score has been determined at each hypothesized depth of interest and then the hypothesized depth at which the fused high resolution image portion best matches the scene captured by the low resolution images is determined based upon the hypothesized depth that yields the highest matching score. In many embodiments, additional termination conditions can be utilized when comparing the forward mapped low resolution images to the captured low resolution images. For example, if a matching score exceeding a predetermined threshold is obtained then the process can terminate and the hypothesized depth that yielded the matching score selected as the appropriate depth.

Although a specific processes are illustrated in FIGS. 6 and 6A, any of a variety of processes can be utilized to determine pixel correspondence between multiple images of a scene that include aliasing in accordance with embodiments of the invention. In many embodiments, the process of verifying hypothesized depths can be performed by generating multiple fused images using low resolution images captured by different sets of focal planes within the array camera module. Processes for verifying hypothesized depths using multiple fused images in accordance with embodiments of the invention are discussed further below.

Hypothesized Fusion Using High Resolution Image Comparison

When performing hypothesized fusion, determining the "correctness" of the fused image would be greatly assisted by knowledge of the scene content or a ground truth aliasing-free image as reference. In the absence of either, array cameras in accordance with many embodiments of the invention partition the focal planes in the imager array into at least two sets, and form a separate fused high resolution image using the low resolution images captured by each set of focal planes. Since aliasing effects are varied in the different images, at incorrect depths, the fused high resolution images are likely to be considerably different. At the correct depth, high resolution information obtained from the aliasing in the low resolution images increases the similarity between a synthesized high resolution image and the scene. Accordingly, two or more high resolution images fused using correct depths will have a significantly higher level of similarity relative to sets of high resolution images fused using incorrect depth assumptions. By comparing high resolution images formed at various depths from the low resolution images captured by each set of focal planes, their mutual similarities form a good measure of "correctness" of the fused images, thus providing a depth estimate for the aliased regions.

Figure 7:
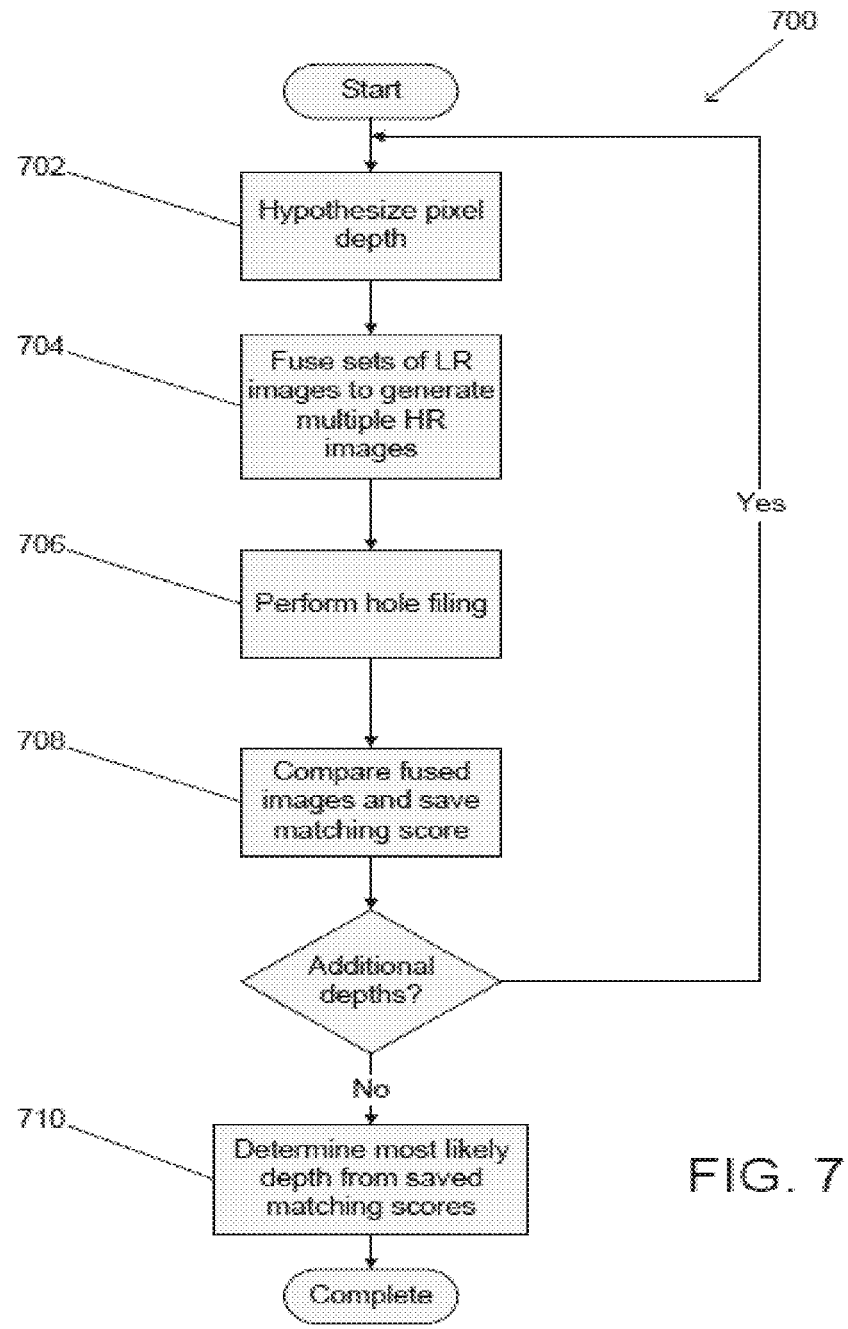
FIG. 7 is a flow chart illustrating a process for performing hypothesized fusion in accordance with embodiments of the invention.

A process for performing hypothesized fusion involving the generation of two fused images in accordance with embodiments of the invention is illustrated in FIG. 7. The process 700 utilizes low resolution images captured by two sets of focal planes in the imager array. In several embodiments, the two sets of focal planes are non-distinct (i.e. some focal planes are included in both sets) such that there is considerable spatial overlap between the camera viewpoints across the two sets of low resolution images. Assuming (702) a particular depth d for one or more points in the scene, the corresponding pixels in each set of low resolution images are fused (704) onto a higher resolution grid generated from a chosen reference viewpoint using known camera calibration information. A simple hole filling mechanism can then be used to fill (706) holes at locations in the fused images where no pixels converge. The two high resolution images are then compared (708) and a robust cost $C(i, d)$ is computed as the error in pixel match (at each location indexed by i) in the two fused images formed using a hypothesized depth d. For each pixel i, the depth is determined (710) as a depth d, for which the error in matching $C(i, d)$ is the least over all the sampled depths. This provides a depth map for all pixels in the image, even in regions with significant variation amongst the low resolution images due to aliasing. In other embodiments, any of a variety of termination conditions can be utilized including (but not limited to) terminating the analysis of different hypothesized depths when a matching score exceeding a threshold is determined.

Although specific processes for determining the most likely hypothesized depth of a pixel in a high resolution image are discussed above with reference to FIG. 7, any of a variety of processes can be utilized involving comparison of two or more fused high resolution images generated using low resolution images captured by sets of focal planes within an imager array in accordance with embodiments of the invention. Processes for partitioning the focal planes in an imager array into sets of focal planes when performing hypothesized fusion in accordance with embodiments of the invention are discussed further below.

Partitioning Focal Planes in an Array Camera Module

In an array camera module, cameras can be partitioned into two or more groups of cameras (irrespective of the particular frequency range captured by the cameras). In a number of embodiments, cameras capturing information in a particular frequency range (color) can be partitioned into two or more groups of cameras for the purpose of performing hypothesized fusion. In many embodiments, the complexity of hypothesized fusion can be reduced by only considering the Green cameras. The spatial shift between cameras causes phase shifts in the aliased frequencies resulting in aliased regions in images that appear considerably different between captured low resolution images of a scene. As discussed earlier, the goal of selecting two or more sets of cameras is to exploit these dissimilarities to fuse similar images at the correct depth hypothesis for each pixel or region within a high resolution image. That is to say, when pixels from each of the sets of low resolution images are placed on a higher resolution grid, the reduction in aliasing effects enables the reconstruction of very similar images for each set (assuming the correct depth hypotheses are used). The difference between the fused images is typically primarily related to the errors in the depth hypotheses.

In many embodiments, each set of low resolution images is used to generate a high resolution image from the viewpoint of a common reference camera. Depending upon the specific imager array used to capture the low resolution images, the reference camera may be located at the center of the camera or in a location offset from the center of the camera. In many embodiments, the high resolution images can be synthesized from a virtual viewpoint. The manner in which the focal planes in an array camera module are partitioned typically depends upon the number of focal planes in the array camera module. In many embodiments, the hypothesized fusion process attempts to construct fused images that are as similar as possible. Since the fusion step attempts to achieve sub-pixel accuracy, errors in camera calibration can lead to differences between the high resolution images created by fusing the low resolution images captured by the sets of focal planes. In many embodiments, the partitioning is performed so that a number of focal planes are common to each set.

Hypothesized fusion can be performed by partitioning the focal planes in an array camera module into two disjoint sets. In a number of embodiments, the focal planes are partitioned into two sets that divide the focal planes in the camera array horizontally, vertically or in any of the diagonal directions. Forming two disjoint sets of cameras, however, is likely to result in a smaller number of focal planes in each set of focal planes (compared to forming overlapping sets of focal planes). With few cameras, a smaller level of magnification can be achieved without leaving large holes that need to be interpolated. Therefore, depending upon the number of focal planes in the imager array, partitioning the focal planes into disjoint sets can result in retaining much of the aliasing effects.

The location of the reference camera or viewpoint can also be an important consideration when partitioning the focal planes in an imager array. Since the fused images are formed using the reference camera as the viewpoint, it is useful to select the viewpoint of an actual camera (as opposed to a virtual viewpoint) as the reference the reference camera in both sets. Additionally, advantages can be obtained by selecting the sets of focal planes such that each set has considerable coverage on any given side (above, below, left and right) of the reference camera. Therefore, in many embodiments each set includes a focal plane above, below, to the left, and to the right of the reference camera. This increases the likelihood that the pixels placed on the higher resolution grid are similarly distributed in either set. At the same time, selecting the sets in this way can minimize errors associated with occlusion zones and increase the likelihood that whatever errors remain are present in each of the fused high resolution images.

The selection of cameras based on the above considerations, typically depends upon the number and grid configuration of the focal planes in an imager array (including the location of color filters within the array camera module), the scene being imaged, and the requirements of specific applications. In several embodiments, a determination is made dynamically concerning the manner in which to partition the focal planes based upon sensor information, and/or the captured low resolution images. In other embodiments, predetermined partitions are utilized.

Figure 8A:
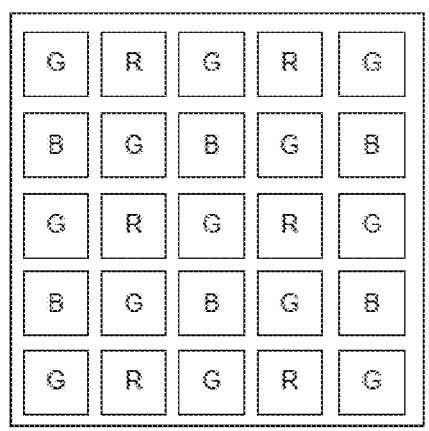
FIG. 8A illustrates an array camera module including 6 Blue cameras, 13 Green Cameras, and 6 Red cameras.
Figure 8B:
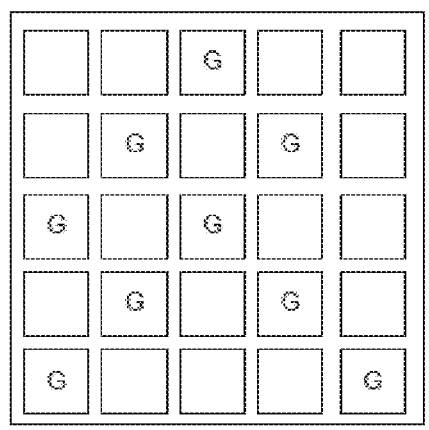
FIGS. 8B and 8C illustrates two sets of Green cameras in the array camera module illustrated in FIG. 8A that can be utilized to perform hypothesized fusion in accordance with embodiments of the invention.
Figure 8C:
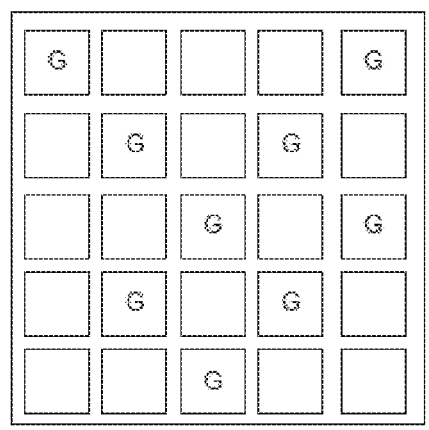

The partitioning of focal planes in an array camera module in accordance with embodiments of the invention is illustrated in FIGS. 8A-8C. A grid of cameras in an array camera module is conceptually illustrated in In FIG. 8A. The array camera module includes a 5×5 configuration of cameras including 6 Blue cameras, 13 Green cameras, and 6 Red cameras. The Green cameras in the array camera module illustrated in FIG. 8A can be partitioned into the two sets illustrated in FIGS. 8B and 8C. The five central Green cameras are common to both sets and the additional four cameras in each set are distinct to the set. Both sets include the central Green camera, which is typically used as a reference camera when synthesizing high resolution images using a 5×5 array. In arrays that don't have a central imager, a Green camera proximate the center of the array is typically utilized as the reference camera.

Although the partitioned sets illustrated in FIGS. 8B and 8C include the same numbers of cameras, in many embodiments the sets can include different numbers of cameras. Furthermore, hypothesized fusion is not limited to using a single type of camera from within the array camera module. The manner in which hypothesized fusion can be performed using low resolution images captured by partitioned sets of focal planes within an imager array in accordance with embodiments of the invention is discussed further below.

Fusion with Depth Hypothesis

Based upon the partitioning of focal planes, the low resolution images captured by the focal planes in each set can be fused onto a high resolution grid. The process of fusing the low resolution images onto the high resolution grid utilizes camera calibration data determined a priori. Placing pixels from a focal plane to a high resolution grid from the viewpoint of the reference camera involves accounting for the relative baselines of the focal planes, the focal length (can be assumed fixed) as well as the depth of the point whose projected pixel is being considered. Initially, the actual depth or distance of the point from the camera plane is unknown. To solve for depth, a list of possible depth hypotheses can be utilized. For each depth d in the list, pixels from each low resolution image in the appropriate set can be placed onto the higher resolution grid taking into account the magnification amount being considered. Since the focal planes within each set capture the same image from a slightly shifted viewpoint, the pixels may be sub-pixel shifted and, hence, may be placed at a slightly different location in the high resolution grid. The final fused image is then formed by some form of interpolation that produces a regularly sampled grid from the randomly sampled observations. Given enough samples arising out of a sufficient number of low resolution images in each set, simple interpolation schemes such as kernel regression can be employed.

Performing fusion using each set of low resolution images provides high resolution images or portions of high resolution images for each hypothesized depth. At incorrect depths, the pixel placements can be expected to be erroneous. As a result, images are obtained that are not really representative of the captured scenes. This is especially true of regions including higher levels of aliasing. As mentioned earlier, the measure of "correctness" is calculated by the similarity of the high resolution images produced by each of the sets of low resolution images. Where focal planes are common to both sets, the low resolution images captured by the common focal planes contribute equally to both the high resolution images at the correct as well as incorrect hypothesized depths. However, at incorrect depths, a sufficiently large number of distinct cameras with quite varied aliasing effects produce a lower match between image regions obtained from different sets of images. Since each of these cameras sample differently shifted images, the samples at any given incorrect depth hypothesis are inaccurately placed on the high resolution grid, increasing the differences between the fused high resolution images created using each set. At the correct depth hypothesis for any given region, when the samples can be expected to be placed correctly, both sets produce images that are sufficiently free of aliasing to achieve a threshold level of similarity. Employing a proper measure of similarity over the entire hypothesized depths, it is possible to estimate the actual depth of an aliased region in the captured low resolution images. Different locations in the image may produce best matches at different depth hypotheses. Choosing the best matches at each location allows the production of a depth estimate for each pixel, and, hence, a depth map for the entire image. In many embodiments, the computational complexity of performing hypothesized fusion can be reduced by only performing hypothesized fusion in regions where a threshold level of aliasing is present. In several embodiments, the computational complexity of performing hypothesized fusion can also be reduced by utilizing information concerning the depth of an adjacent region or pixel to commence the search for a correct depth. When a threshold level of similarity is achieved, a depth can be selected. In this way, the number of depth hypotheses tested by the process can be reduced in regions having similar depths. Processes for determining the similarity of regions of fused high resolution images when performing hypothesized fusion in accordance with embodiments of the invention are discussed further below.

Determining Similarity

Estimating the correct depth at any given location during hypothesized fusion relies on an ability to accurately measure the similarity between fused high resolution images. In a number of embodiments, image patches are used to determine local similarities. Comparisons of portions or patches of images provide robustness to the presence of noise, which can be expected to corrupt the captured low resolution images. Further, uses of small image portions can account for the local content surrounding a pixel under consideration when comparing fused high resolution images, thereby avoiding spurious matches. For each pixel in the high resolution grid where a pixel from the reference camera is positioned, a M×N patch is formed with the pixel of interest at its center. This is done for images from each set. Where the focal planes are partitioned into two sets, these image portions $p_{1,i}$ and $p_{2,i}$ are then compared using a measure of their difference. In a number of embodiments, an $L_1$ or an $L_2$ norm is used to measure the difference although other measures appropriate to the requirements of a specific application can also be utilized. Note that this can be done for each portion in the high resolution image, and for each hypothesized depth. Mathematically, the cost C(i, d) is obtained using the following expression:

$$C(i,d) = \|p_{1,i} - p_{2,i}\|_2 \quad (2)$$

Once such a cost is computed for all hypothesized depths, the depth at each location of interest (e.g. each pixel from the reference camera) can be computed as $$\hat{d}_i = \operatorname*{argmin}_{d} C(i, d). \quad (3)$$

Although there exists many cost functions that may be utilized to compare two image portions or patches for similarity, the $L_2$ norm provides a simple yet effective measure of similarity appropriate to many applications. Experimental evidence that illustrates the recovery of high frequency information from low resolution images in which aliasing is introduced using pixel apertures using hypothesized fusion processes, similar to the hypothesized fusion processes described above, is discussed below.

Recovery of High Frequency Information super-resolution processes in accordance with embodiments of the invention can utilize aliasing within captured images of a scene to recover high frequency information. The increase in resolution of the resulting synthesized images can be appreciated by comparing images synthesized from images captured using imager arrays constructed to minimize aliasing and images synthesized from images captured using imager arrays constructed to introduce aliasing into the captured image (e.g. by using microlenses that create pixel apertures).

A simulation of the resolution improvement that can be obtained by introducing aliasing into captured images in accordance with embodiments of the invention is illustrated in FIGS. 9A and 9B. FIG. 9A is a first super-resolution image 900 synthesized using images captured by a 5×5 array of VGA resolution imagers, where each pixel in the imager has a pixel pitch of 2.2 μm. FIG. 9B is a second super-resolution image 902 synthesized by simulating images captured by a 5×5 array of VGA resolution images, where each pixel has a 2.2 μm pixel pitch, but is sampled in a 1.4 μm area due to the use of microlenses that do not span the full 2.2 μm pixel pitch to create a pixel aperture. It can be noted, that a similar effect in terms of reduction of blur can be achieved by using a smaller active area than the full span of the pixel pitch. The use of microlens pixel apertures in this way increases the aliasing in the captured low resolution images. As can be appreciated in a corresponding region 904 in each image, the ability of the super-resolution processing to recover high frequency information is enhanced due to the increase in aliasing in the captured images caused by the pixel apertures. Super-resolution processes may, however, rely on hypothesized fusion to provide correct depth information.

The size of the microlenses and therefore the implied sizes of the gaps between the microlenses is a tradeoff between increased aliasing and decreased sensitivity. Assuming square pixels and therefore square microlenses the area covered by the microlenses is proportional to the square of the pixel pitch. An additional consideration is the reduction of the pixel stack and therefore a concomitant reduction in the cross-talk between adjacent pixels. The removal of the color filter from the pixel stack has the potential of reducing the pixel stack height by 30%. In many embodiments, the consequent reduction in cross-talk through pixel stack height reduction results in increased sensitivity and can be traded-off for increased aliasing. Similar issues are faced by pixels including microlenses that are not square.

Although specific imager resolutions and pixel sizes are described above, as can readily be appreciated the imager resolution, the pixel sizes, and the apertures used to introduce aliasing into the captured images can be selected as appropriate to the requirements of a specific application in accordance with embodiments of the invention.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed:

1. An imager array, comprising:
a plurality of focal planes, where each focal plane comprises a two dimensional arrangement of pixels having at least two pixels in each dimension and each focal plane is contained within a region of the imager array that does not contain pixels from another focal plane wherein each of the at least two pixels in the two dimensional arrangement of pixels comprises a pixel stack including a microlens and a pixel area where the microlens acts as a pixel aperture focusing light incident to the surface of the microlens on an active area in the pixel area where the size of the active area is less than a pixel pitch between pixels in the two dimensional arrangement and wherein the pixel pitch and the active area are sized based upon a desired resolution factor of super resolution processing performed on images captured by the plurality of focal planes to introduce a desired amount of aliasing into image data captured by each of the plurality of focal planes;
control circuitry configured to control the capture of image information by the pixels within the focal planes; and
sampling circuitry configured to convert pixel outputs into digital pixel data.

2. The imager array of claim 1, wherein the pixel aperture is formed by a microlens that is smaller than an active area of a pixel.

3. The imager array of claim 2, wherein gaps exist between adjacent microlenses in the pixel stacks of adjacent pixels in the two dimensional arrangement of pixels of a focal plane.

4. The imager array of claim 3, wherein light is prevented from entering the pixel stacks in the two dimensional arrangement of pixels of a focal plane through the gaps between the microlenses by a light blocking material.

5. The imager array of claim 4, wherein photoresist is located in the gaps between the microlenses in the two dimensional arrangement of pixels of a focal plane.

6. The imager array of claim 2, wherein the amount of aliasing in an image captured by a focal plane is greater than the amount of aliasing that would be present were the microlens to occupy the entire pixel area defined by the pixel stack.

7. The imager array of claim 2, wherein the pixel stack further comprise an oxide layer and the microlens sits atop the oxide layer.

8. The imager array of claim 7, wherein the pixel stack includes a color filter.

9. The imager array of claim 8, wherein the color filters in the pixel stack of each pixel in the two dimensional arrangement of pixels within a focal plane are the same.

10. The imager array of claim 8, wherein the color filters in the pixel stacks of the two dimensional arrangement of pixels within at least one focal plane form a Bayer filter pattern.

11. The imager array of claim 7, wherein the pixel stack does not include a color filter.

12. The imager array of claim 7, wherein the pixel stack includes a nitride passivation layer and a bottom oxide layer that provides support and isolation for metal interconnects.

13. The imager array of claim 1, wherein the pixel aperture is formed using at least one light blocking material.

14. An imager array, comprising:
a plurality of focal planes, where each focal plane comprises a two dimensional arrangement of pixels having at least two pixels in each dimension and each focal plane is contained within a region of the imager array that does not contain pixels from another focal plane wherein each of the at least two pixels in the two dimensional arrangement of pixels comprises a pixel stack including a microlens and an pixel area where the microlens acts as a pixel aperture focusing light incident to the surface of the microlens on an active area of the pixel area and the size of the active area is less than a pixel pitch between pixels in the two dimensional arrangement where the pixel pitch and the active area are sized to introduce a desired amount of aliasing into image data captured by each of the plurality of focal plane based upon a super resolution factor of super resolution processing that generates a super resolution image from image data captured by the plurality of focal planes and wherein gaps exist between microlenses in the pixel stacks of adjacent pixels in the two dimensional pixel arrangements of the plurality of focal planes and the pixel stack of each of the pixels in the two dimensional arrangement includes light blocking material to prevent light from entering the pixel stacks through the gaps between the microlenses;
control circuitry configured to control the capture pixels outputs from the pixels within the focal planes; and
sampling circuitry configured to convert the pixel outputs into image data.

15. An array camera module, comprising:
an imager array configured to capture light field image data, comprising:
a plurality of focal planes, where each focal plane comprises a two dimensional arrangement of pixels having at least two pixels in each dimension and each focal plane is contained within a region of the imager array that does not contain pixels from another focal plane wherein the at least two pixels in the two dimensional arrangement of pixels comprises a pixel stack including a microlens and a pixel area where the microlens acts as a pixel aperture and focuses light incident to the surface of the microlens on an active area of the pixel area where the active area is less in size than a pixel pitch between pixels in the two dimensional arrangement and the pixel pitch and the active area are sized to introduce a desired amount of aliasing into the light field image data captured by a pixel based upon a super resolution factor of super resolution processing that generates a super resolution image from the light field image data captured by the plurality of focal planes;

control circuitry configured to control the capture of pixel outputs from the pixels within the focal planes; and sampling circuitry configured to convert the pixel outputs into light field image data.

16. The array camera module of claim 15, wherein the pixel aperture formed by a microlens is smaller than the pixel area.

17. The array camera module of claim 16, wherein gaps exist between adjacent microlenses in the pixel stacks of adjacent pixels in the two dimensional arrangement of pixels of a focal plane.

18. The array camera module of claim 17, wherein light is prevented from entering the pixel stacks through the gaps between the microlenses of pixels in the two dimensional arrangement of pixels of a focal plane by a light blocking material.

19. The array camera module of claim 18, wherein photoresist is located in the gaps between the microlenses of pixels in the two dimensional arrangement of pixels of a focal plane.

20. The array camera module of claim 16, wherein the amount of aliasing in light field image data captured by a focal plane is greater than the amount of aliasing that would be present were the microlens to occupy the entire pixel area defined by the pixel stack.

21. The array camera module of claim 16, wherein the pixel stack of each pixel in the two dimensional arrangement of pixels within at least one focal plane further comprise an oxide layer and the microlens sits atop the oxide layer.

22. The array camera module of claim 21, wherein the pixel stack of each pixel in the two dimensional arrangement of pixels within at least one focal plane includes a color filter.

23. The array camera module of claim 22, wherein the color filters in the pixel stack of each pixel in the two dimensional arrangement of pixels within at least one focal plane of the two dimensional arrangement of pixels within a focal plane are the same.

24. The array camera module of claim 22, wherein the color filters in the pixel stacks of the two dimensional arrangement of pixels within at least one focal plane form a Bayer filter pattern.

25. The array camera module of claim 21, wherein the pixel stack includes a nitride passivation layer and a bottom oxide layer that provides support and isolation for metal interconnects.

26. The array camera module of claim 15, wherein the pixel aperture is formed using at least one light blocking material.

* * * * *